United States Patent
Kawahara et al.

(10) Patent No.: US 10,686,229 B2
(45) Date of Patent: Jun. 16, 2020

(54) BATTERY STATE DETECTION DEVICE, SECONDARY BATTERY SYSTEM, PROGRAM PRODUCT, AND BATTERY STATE DETECTION METHOD

(71) Applicant: Vehicle Energy Japan Inc., Hitachinaka-shi, Ibaraki-ken (JP)

(72) Inventors: Youhei Kawahara, Tokyo (JP); Masahiro Yonemoto, Tokyo (JP); Keiichiro Ohkawa, Hitachinaka (JP)

(73) Assignee: Vehicle Energy Japan Inc., Hitachinaka-shi, Ibaraki-ken (JP)

( * ) Notice: Subject to any disclaimer, the term of this patent is extended or adjusted under 35 U.S.C. 154(b) by 0 days.

(21) Appl. No.: 15/318,828

(22) PCT Filed: Jun. 12, 2015

(86) PCT No.: PCT/JP2015/067006
§ 371 (c)(1),
(2) Date: Dec. 14, 2016

(87) PCT Pub. No.: WO2016/009756
PCT Pub. Date: Jan. 21, 2016

(65) Prior Publication Data
US 2017/0141444 A1     May 18, 2017

(30) Foreign Application Priority Data
Jul. 17, 2014   (JP) ................. 2014-146749

(51) Int. Cl.
*H01M 10/42* (2006.01)
*B60L 3/00* (2019.01)
(Continued)

(52) U.S. Cl.
CPC ....... *H01M 10/4285* (2013.01); *B60L 3/0038* (2013.01); *B60L 58/13* (2019.02);
(Continued)

(58) Field of Classification Search
CPC ......... H01M 10/4285; H01M 10/0525; H01M 10/48; H01M 10/486; H01M 2220/20;
(Continued)

(56) References Cited

U.S. PATENT DOCUMENTS

2005/0035742 A1*  2/2005  Koo ...................... H02J 7/0047
                                                              320/149
2005/0110498 A1   5/2005  Plett
(Continued)

FOREIGN PATENT DOCUMENTS

EP    2 720 343 A1    4/2014
JP    2006-197727 A   7/2006
(Continued)

OTHER PUBLICATIONS

International Search Report (PCT/ISA/210) issued in PCT Application No. PCT/JP2015/067006 dated Sep. 8, 2015 with English translation (Four (4) pages).
(Continued)

*Primary Examiner* — Michael P Nghiem
*Assistant Examiner* — Dacthang P Ngo
(74) *Attorney, Agent, or Firm* — Crowell & Moring LLP

(57) ABSTRACT

A battery state detection device detects a battery state and includes: a first permissible current calculating unit configured to calculate a first permissible current of a battery based on a voltage of the battery detected by a voltage detecting unit; a second permissible current calculating unit configured to calculate a second permissible current of the battery without using the voltage of the battery; and a permissible current determining unit configured to determine a permissible current of the battery corresponding to the battery state on the basis of at least one of the first permissible current and the second permissible current.

11 Claims, 26 Drawing Sheets

(51) Int. Cl.
*G01R 31/36* (2020.01)
*B60L 58/21* (2019.01)
*B60L 58/13* (2019.01)
*G01R 31/392* (2019.01)
*H01M 10/48* (2006.01)
*H02J 7/00* (2006.01)
*G01R 31/3828* (2019.01)
*H01M 10/0525* (2010.01)

(52) U.S. Cl.
CPC ............. *B60L 58/21* (2019.02); *G01R 31/36* (2013.01); *G01R 31/3648* (2013.01); *G01R 31/3828* (2019.01); *G01R 31/392* (2019.01); *H01M 10/0525* (2013.01); *H01M 10/48* (2013.01); *H01M 10/486* (2013.01); *H02J 7/00* (2013.01); *B60L 2240/545* (2013.01); *B60L 2240/547* (2013.01); *B60L 2240/549* (2013.01); *H01M 2220/20* (2013.01); *Y02E 60/122* (2013.01); *Y02T 10/7011* (2013.01); *Y02T 10/7044* (2013.01); *Y02T 10/7061* (2013.01)

(58) Field of Classification Search
CPC .............. G01R 31/361; G01R 31/3648; G01R 31/392; G01R 31/3828; G01R 31/36; B60L 58/13; B60L 58/21; B60L 3/0038; B60L 2240/545; B60L 2240/547; B60L 2240/549; H02J 7/00; Y02E 60/122; Y02T 10/7011; Y02T 10/7044; Y02T 10/7061
USPC .......................................................... 702/63
See application file for complete search history.

(56) References Cited

U.S. PATENT DOCUMENTS

| | | | |
|---|---|---|---|
| 2006/0152196 A1 | 7/2006 | Matsumoto et al. | |
| 2008/0094035 A1 | 4/2008 | Plett | |
| 2010/0174500 A1 | 7/2010 | Plett | |
| 2010/0250038 A1 | 9/2010 | Morita et al. | |
| 2013/0043876 A1 | 2/2013 | Liu et al. | |
| 2013/0271148 A1 | 10/2013 | Maeda | |
| 2014/0302355 A1 | 10/2014 | Boehm et al. | |
| 2014/0339891 A1* | 11/2014 | Ohkawa | H01M 10/44 307/9.1 |
| 2015/0108991 A1 | 4/2015 | Aoshima et al. | |

FOREIGN PATENT DOCUMENTS

| | | | | |
|---|---|---|---|---|
| JP | 2008-122165 A | | 5/2008 | |
| JP | 4722857 B2 | | 7/2011 | |
| JP | 2012-132726 A | | 7/2012 | |
| JP | 4987581 B2 | | 7/2012 | |
| JP | 5040733 B2 | | 10/2012 | |
| JP | 2014-35283 A | | 2/2014 | |
| WO | WO 2012/076220 A1 | | 6/2012 | |
| WO | WO 2013/094057 | * | 6/2013 | ............ H02J 7/0021 |
| WO | WO 2013/094057 A1 | | 6/2013 | |
| WO | WO 2013/175606 A1 | | 11/2013 | |

OTHER PUBLICATIONS

Japanese-language Written Opinion (PCT/ISA/237) issued in PCT Application No. PCT/JP2015/067006 dated Sep. 8, 2015 (Four (4) pages).
Extended European Search Report issued in counterpart European Patent Application No. 15821942.8 dated Mar. 1, 2018 (Twelve (12) pages).
Cover page of EP 2 649 666 A1 published Oct. 16, 2013.
"A Guide to Understanding Battery Specifications", MIT Electric Vehicle Team, Dec. 1, 2008, pp. 1-3, XP055162679.
Rabinovich, "Combining the Results of Measurements", Measurement Errors and Uncertainty, Dec. 1, 2005, Springer, New York, NY, pp. 219-236, XP055444845.
Chinese-language Office Action issued in counterpart Chinese Application No. 201580038922.4 dated Jun. 4, 2019 with English translation (23 pages).

* cited by examiner

BATTERY STATE DETECTION DEVICE, SECONDARY BATTERY SYSTEM, PROGRAM PRODUCT, AND BATTERY STATE DETECTION METHOD

TECHNICAL FIELD

The present invention relates to a battery state detection device, a secondary battery system, a program product, and a battery state detection method.

BACKGROUND ART

In general, a secondary battery system such as a power supply device, a distributed power storage device, and an electric automobile using a secondary battery as power storage means is provided with a battery control circuit that manages a battery state. Representative examples of an index which is used for the battery control circuit to manage the battery state include a state of charge (SOC), a state of health (SOH), a permissible current, and a permissible power. The SOC indicates to what extent the battery is charged (what amount of charges dischargeable remains in the battery), and the SOH indicates to what extent the battery deteriorates from an initial state. The permissible current is a maximum value of a chargeable/dischargeable current of the battery, and the permissible power is a value which is obtained by multiplying the permissible current by a battery voltage.

The permissible current of the battery includes a permissible charging current indicating the permissible current in charging and a permissible discharging current indicating the permissible current in discharging. When the SOC is high, the permissible charging current decreases and the permissible discharging current increases. On the other hand, when the SOC is low, the permissible charging current increases and the permissible discharging current decreases. When the battery control circuit can correctly detect the permissible currents, various types of secondary battery systems can maximally utilize charging/discharging performance of a battery. Accordingly, it is extremely important to establish a high-accuracy permissible current detection method.

As a technique of detecting a permissible current, a battery chargeable/dischargeable power estimating method described in PTL 1 has been proposed. In this technique, a current value of a charging/discharging current flowing in a battery is detected, an open voltage of the battery is calculated on the basis of a current-integrated capacity calculated from the detected current value of the charging/discharging current, and chargeable/dischargeable power in a predetermined time from a charging/discharging changing point of the battery is estimated on the basis of the detected current value and the calculated open voltage.

CITATION LIST

Patent Literature

PTL 1: Japanese Patent No. 5040733

SUMMARY OF INVENTION

Technical Problem

In order to detect a permissible charging current and a permissible discharging current of a battery, it is necessary to understand internal resistance of the battery in charging and discharging. The internal resistance value of the battery varies in real time depending on charging/discharging duration, charging/discharging history, or the like. Accordingly, in order to detect the permissible charging current and the permissible discharging current with high accuracy, it is preferable to calculate the internal resistance value in charging and the internal resistance value in discharging in real time. Here, the internal resistance value in charging is calculated using a detection result of a battery voltage in charging and the internal resistance value in discharging is calculated using a detection result of the battery voltage in discharging. However, since a battery cannot simultaneously perform charging and discharging, it is not possible to calculate both the internal resistance value in charging and the internal resistance value in discharging in real time. For this reason, it is difficult to detect a permissible current of a battery with high accuracy using a conventional method.

Solution to Problem

According to an aspect of the present invention, there is provided a battery state detection device that detects a battery state, including: a first permissible current calculating unit configured to calculate a first permissible current of a battery based on a voltage of the battery detected by a voltage detecting unit; a second permissible current calculating unit configured to calculate a second permissible current of the battery without using the voltage of the battery; and a permissible current determining unit configured to determine a permissible current of the battery corresponding to the battery state on the basis of at least one of the first permissible current and the second permissible current.

According to another aspect of the present invention, there is provided a secondary battery system including: the above-mentioned battery state detection device; and a secondary battery of which a voltage is detected by the voltage detecting unit and which is subjected to charging or discharging on the basis of the permissible current determined by the permissible current determining unit.

According to another aspect of the present invention, there is provided a program product which is executed by a computer in a battery state detection device connected to a battery, causing the computer to function as: a first permissible current calculating unit configured to calculate a first permissible current of the battery based on a voltage detection result of the battery; a second permissible current calculating unit configured to calculate a second permissible current of the battery without using the voltage detection result of the battery; and a permissible current determining unit configured to determine a permissible current of the battery corresponding to a battery state on the basis of at least one of the first permissible current and the second permissible current.

According to another aspect of the present invention, there is provided a battery state detection method of detecting a battery state, including: detecting a voltage of a battery; calculating a first permissible current of the battery based on the voltage detection result of the battery; calculating a second permissible current of the battery without using the voltage detection result of the battery; and determining a permissible current of the battery corresponding to the battery state on the basis of at least one of the first permissible current and the second permissible current.

Advantageous Effects of Invention

According to the present invention, it is possible to detect a permissible current of a battery with high accuracy.

DESCRIPTION OF EMBODIMENTS

Hereinafter, embodiments of the present invention will be described with reference to the accompanying drawings. In the following embodiments, it is assumed that the present invention is applied to a battery system constituting a power supply of a plug-in hybrid electric vehicle (PHEV).

In the following embodiments, an assembled battery is constituted by connecting single cells employing a lithium ion battery in series, but an assembled battery may be constituted by connecting parallel connections of single cells in series or an assembled battery may be constituted by connecting series connections of single cells in parallel.

First Embodiment

Figure 1:
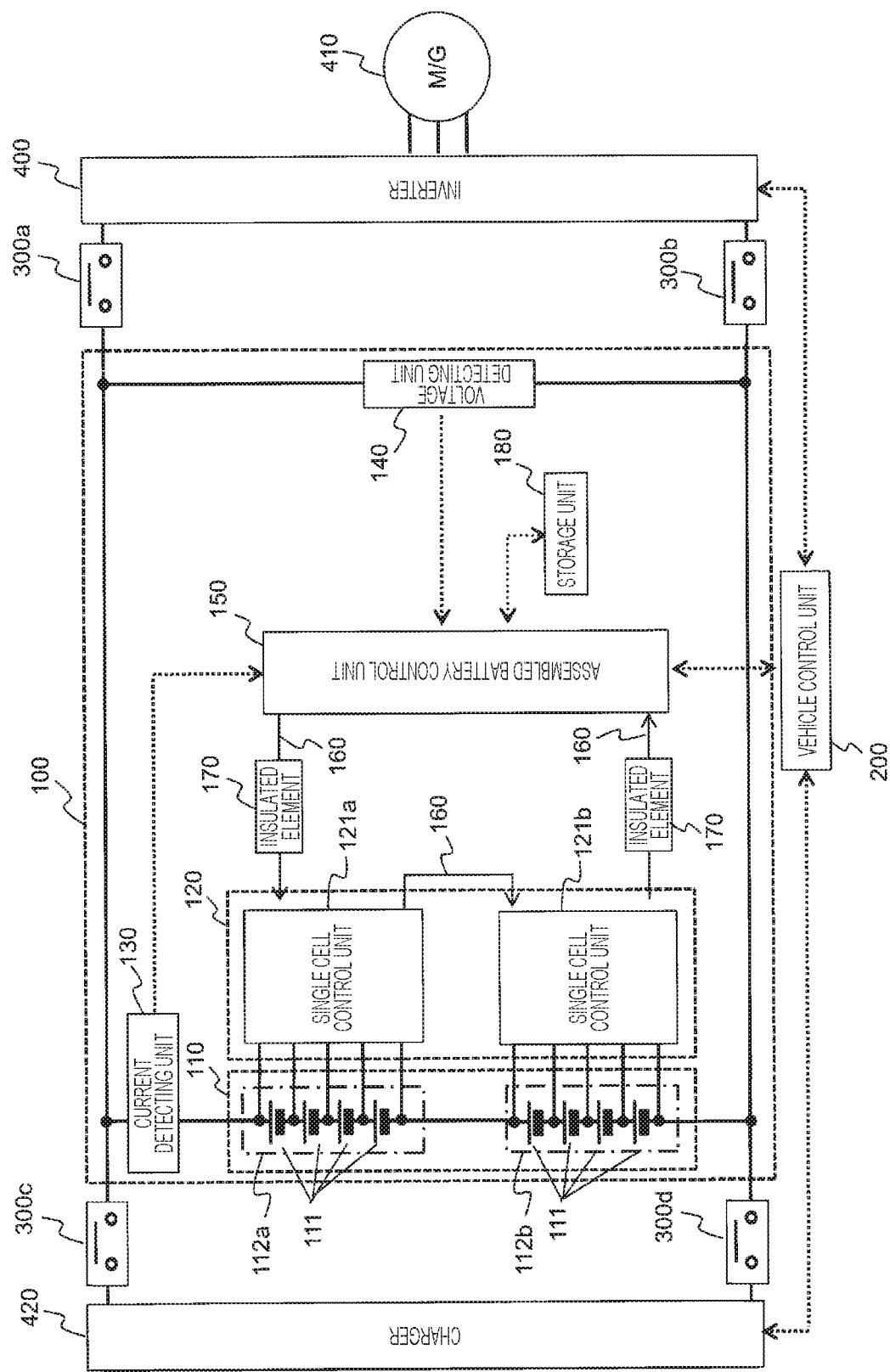
FIG. 1 is a diagram illustrating configurations of a battery system according to a first embodiment of the present invention and a periphery thereof.

FIG. 1 is a diagram illustrating configurations of a battery system 100 and a periphery thereof according to a first embodiment of the present invention. The battery system 100 is connected to an inverter 400 via relays 300a and 300b, and is connected to a charger 420 via relays 300c and 300d. The battery system 100 includes an assembled battery 110, a single cell managing unit 120, a current detecting unit 130, a voltage detecting unit 140, an assembled battery control unit 150, and a storage unit 180.

The assembled battery 110 includes plural single cells 111. The single cell managing unit 120 monitors states of the single cells 111. The current detecting unit 130 detects a current that flows in the battery system 100. The voltage detecting unit 140 detects a total voltage of the assembled battery 110. The assembled battery control unit 150 detects a state of the assembled battery 110 and also performs management of the state or the like.

The assembled battery control unit 150 functions as a battery state detection device that detects the state of the assembled battery 110 in the battery system 100. The assembled battery control unit 150 receives a battery voltage or a temperature of each single cell 111 transmitted from the single cell managing unit 120, a current value flowing in the battery system 100 and transmitted from the current detecting unit 130, and a total voltage value of the assembled battery 110 transmitted from the voltage detecting unit 140.

The assembled battery control unit 150 detects the state of the assembled battery 110 on the basis of the received information. The state detection result of the assembled battery control unit 150 is transmitted to the single cell managing unit 120 or a vehicle control unit 200.

The assembled battery 110 is constituted by electrically connecting plural single cells 111, which can accumulate and discharge electrical energy (which can be filled with or discharge DC power), in series. The single cells 111 constituting the assembled battery 110 are grouped in a predetermined number of units in performing management and control of states. The grouped single cells 111 are electrically connected in series to constitute single cell groups 112a and 112b. The number of single cells 111 constituting single cell group 112 may be the same in all the single cell groups 112 or the number of single cells 111 may vary depending on the single cell groups 112.

The single cell managing unit 120 monitors the states of the single cells 111 constituting the assembled battery 110. The single cell managing unit 120 includes a single cell control unit 121 provided for each single cell group 112. In FIG. 1, the single cell control units 121a and 121b are provided to correspond to the single cell groups 112a and 112b. Each single cell control unit 121 monitors and controls the states of the single cells 111 constituting the corresponding single cell group 112.

In this embodiment, for the purpose of simplification of explanation, four single cells 111 are electrically connected in series to constitute the single cell groups 112a and 112b, and the single cell groups 112a and 112b are electrically connected in series to constitute the assembled battery 110 including total eight single cells 111.

The assembled battery control unit 150 and the single cell managing unit 120 transmit and receive a signal via an insulated element 170 such as a photo coupler and a signal communication unit 160.

Communication between the assembled battery control unit 150 and the single cell control units 121a and 121b constituting the single cell managing unit 120 will be described below. The single cell control units 121a and 121b are connected in series in an order of potential of the single cell groups 112a and 112b. A signal which is transmitted from the assembled battery control unit 150 to the single cell managing unit 120 is input to the single cell control unit 121a via the insulated element 170 and the signal communication unit 160. The output of the single cell control unit 121a is input to the single cell control unit 121b via the signal communication unit 160, and the output of the lowest single cell control unit 121b is transmitted to the assembled battery control unit 150 via the insulated element 170 and the signal communication unit 160. In the first embodiment, no insulated element 170 is interposed between the single cell control unit 121a and the single cell control unit 121b, but both single cell control units may transmit and receive a signal therebetween via the insulated element 170.

The storage unit 180 stores information such as internal resistance characteristics, full-charged capacities, polarization voltages, state-of-health characteristics, and individual difference information of the assembled battery 110, the single cells 111, and the single cell groups 112, and a correspondence between a state of charge (SOC) and an open circuit voltage (OCV). The storage unit may store characteristic information of the single cell managing unit 120, the single cell control units 121, and the assembled battery control unit 150 in advance. Even when the operation of the battery system 100, the assembled battery control unit 150, or the like is stopped, a variety of information stored in the storage unit 180 is held.

The assembled battery control unit 150 performs calculation for detecting an SOC, an SOH, permissible charging/discharging current or power, or the like of one or more single cells 111 using information received from the single cell managing unit 120, the current detecting unit 130, the voltage detecting unit 140, and the vehicle control unit 200, an SOC table 501 or a resistance characteristic table 901 to be described later, or the like. The assembled battery control unit 150 outputs information to the single cell managing unit 120 or the vehicle control unit 200 on the basis of the calculation result.

The vehicle control unit 200 controls the inverter 400 connected to the battery system 100 via the relays 300a and 300b using the information transmitted from the assembled battery control unit 150. The vehicle control unit 200 also controls the charger 420 connected to the battery system 100 via the relays 300c and 300d. At the time of a vehicle running, the battery system 100 is connected to the inverter 400 and drives the motor-generator 410 using energy accumulated in the assembled battery 110. At the time of charging, the battery system 100 is connected to the charger 420 and is charged with a supply of power from a household power supply or a charging stand.

The charger 420 is used to charge the assembled battery 110 using an external power supply such as a household power supply or a charging stand. In the first embodiment, the charger 420 is configured to control a charging voltage, a charging current, and the like in accordance with a command from the vehicle control unit 200, but may control them in accordance with a command from the assembled battery control unit 150. The charger 420 may be installed inside or outside the vehicle depending on a configuration of the vehicle, performance of the charger 420, a purpose of use, an installation condition of an external power supply, and the like.

When a vehicle system having the battery system 100 mounted thereon starts up and runs, the battery system 100 is connected to the inverter 400 and drives the motor-generator 410 using the energy accumulated in the assembled battery 110 under the control of the vehicle control unit 200. At the time of regeneration, the assembled battery 110 is charged with power generated by the motor-generator 410. When a vehicle having the battery system 100 is connected to an external power supply such as a household power supply or a charging stand, the battery system 100 is connected to the charger 420 on the basis of the information transmitted from the vehicle control unit 200 and the assembled battery 110 is charged until a predetermined condition is satisfied. The energy accumulated in the assembled battery 110 by the charging is used for the vehicle to run in a next time or is used to cause electrical units inside or outside the vehicle to operate. The energy may be discharged to an external power supply such as a household power supply if necessary.

Figure 2:
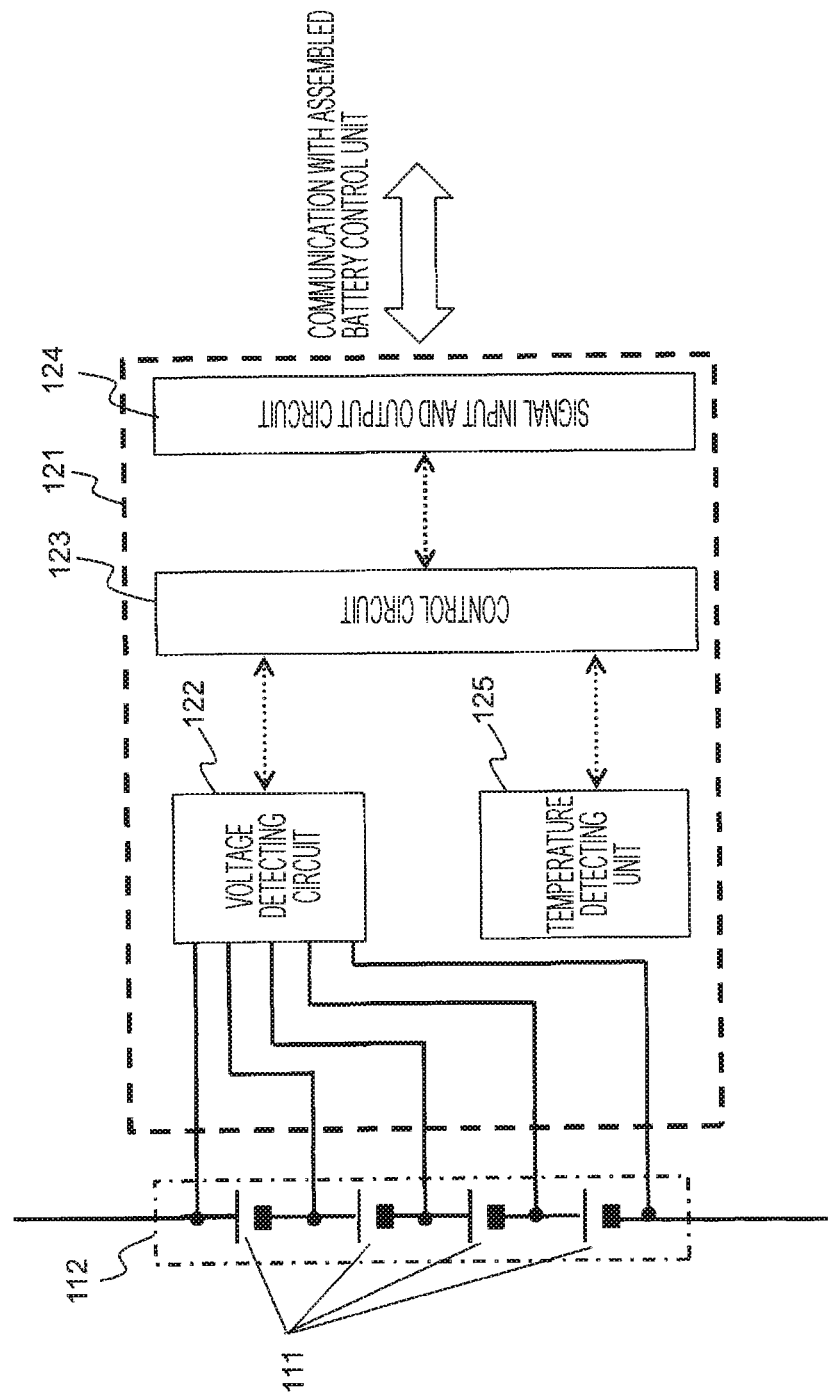
FIG. 2 is a diagram illustrating a circuit configuration of a single cell control unit.

FIG. 2 is a diagram illustrating a circuit configuration of the single cell control unit 121. The single cell control unit 121 includes a voltage detecting circuit 122, a control circuit 123, a signal input/output circuit 124, and a temperature detecting unit 125. The voltage detecting circuit 122 measures an inter-terminal voltage of each single cell 111. The control circuit 123 receives measurement results from the voltage detecting circuit 122 and the temperature detecting unit 125 and transmits the received measurement results to the assembled battery control unit 150 via the signal input/ output circuit 124. A circuit configuration which is generally mounted on the single cell control unit 121 so as to equalize a voltage or SOC variation in the single cells 111 occurring with self-discharging, a current consumption variation, or the like is determined to be widely known and is not described herein.

The temperature detecting unit 125 of the single cell control unit 121 in FIG. 2 has a function of measuring a temperature of the single cell group 112. The temperature detecting unit 125 measures a single temperature of the single cell group 112 as a whole and treats the measured temperature as a representative temperature value of the single cells 111 constituting the single cell group 112. The temperature measured by the temperature detecting unit 125 is used for various calculations for detecting the state of the single cell 111, the single cell group 112, or the assembled battery 110. Since FIG. 2 is based on this premise, the single cell control unit 121 is provided with a single temperature detecting unit 125. The temperature detecting unit 125 may be disposed for each single cell 111 and measure a temperature for each single cell 111, and various calculations may be performed on the basis of the temperature for each single cell 111. However, in this case, the number of temperature detecting units 125 increases and thus the configuration of the single cell control unit 121 is complicated.

In FIG. 2, the temperature detecting unit 125 is illustrated simply. Actually, a temperature sensor is installed in a temperature measurement target and the installed temperature sensor outputs temperature information as a voltage. The measurement result is transmitted to the signal input/output circuit 124 via the control circuit 123 and the signal input/output circuit 124 outputs the measurement result to the outside of the single cell control unit 121. A function of realizing this series of flow is mounted as the temperature detecting unit 125 on the single cell control unit 121, and the voltage detecting circuit 122 may be used to measure the temperature information (the voltage).

Various calculations which are performed by the assembled battery control unit 150 will be described below. The assembled battery control unit 150 is embodied by a microcomputer or the like and can perform various processes or calculations to be described below by executing various programs.

Figure 3:
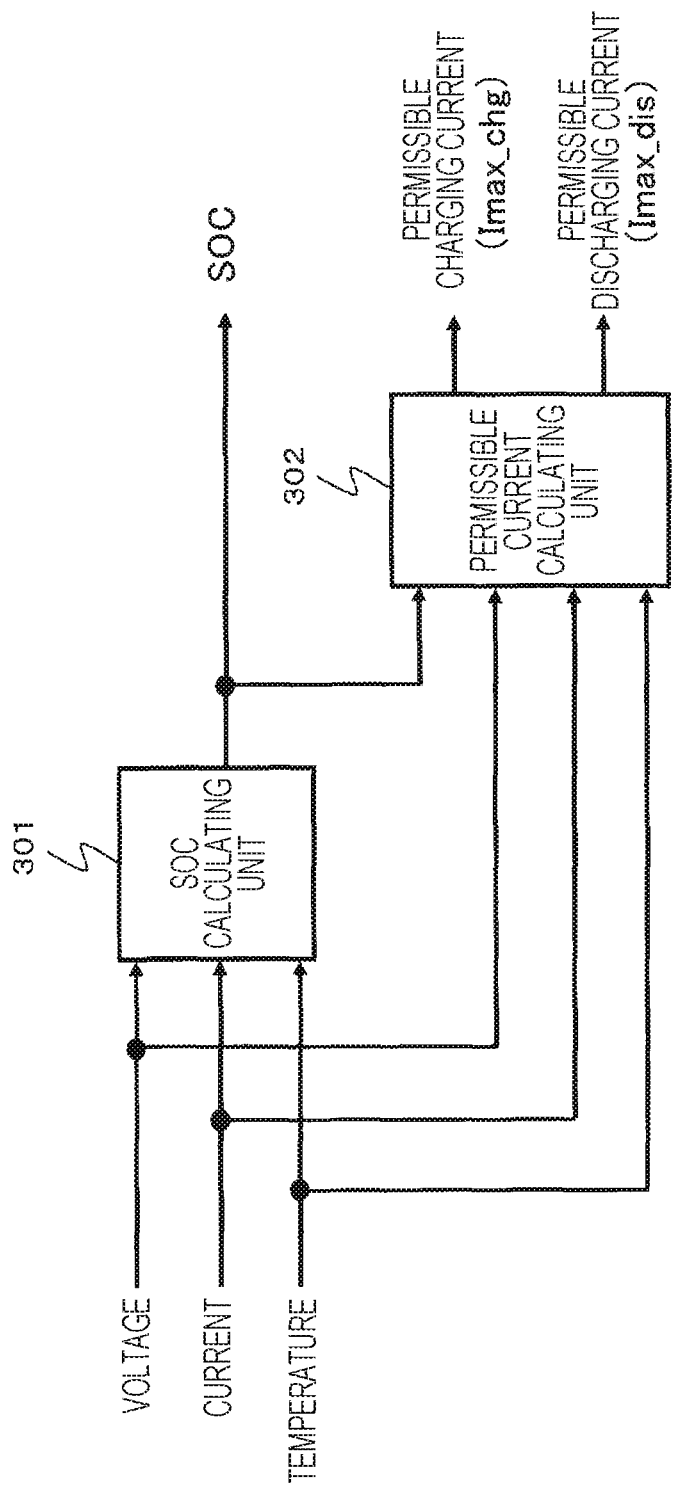
FIG. 3 is a block diagram illustrating processing details which are performed by an assembled battery control unit according to the first embodiment of the present invention.

FIG. 3 is a block diagram illustrating processing details which are performed by the assembled battery control unit 150 according to the first embodiment of the present invention. The assembled battery control unit 150 functionally includes an SOC calculating unit 301 and a permissible current calculating unit 302. The SOC calculating unit 301 calculates an SOC using a voltage, a current, and a temperature. The permissible current calculating unit 302 calculates a permissible charging current (Imax_chg) and a permissible discharge current (Imax_dis) using the voltage, the current, the temperature, and the SOC calculated by the SOC calculating unit 301. Imax_chg indicates a permissible current of the assembled battery 110 in charging, that is, a maximum current which can flow at the time of charging the assembled battery 110. Imax_dis indicates a permissible current of the assembled battery 110 in discharging, that is, a maximum current which can flow at the time of discharging power from the assembled battery 110.

The SOC calculating unit 301 estimates the SOC of the assembled battery 110 on the basis of a voltage which is acquired by dividing the inter-terminal voltage of the assembled battery 110 measured by the voltage detecting unit 140 by the number of series of the single cells 111, the current I measured by the current detecting unit 130, and the temperature T measured by the temperature detecting unit 125. An SOC estimating process based on a voltage will be described below as an example of the processing details for estimating the SOC, which is performed by the SOC calculating unit 301.

Figure 4:
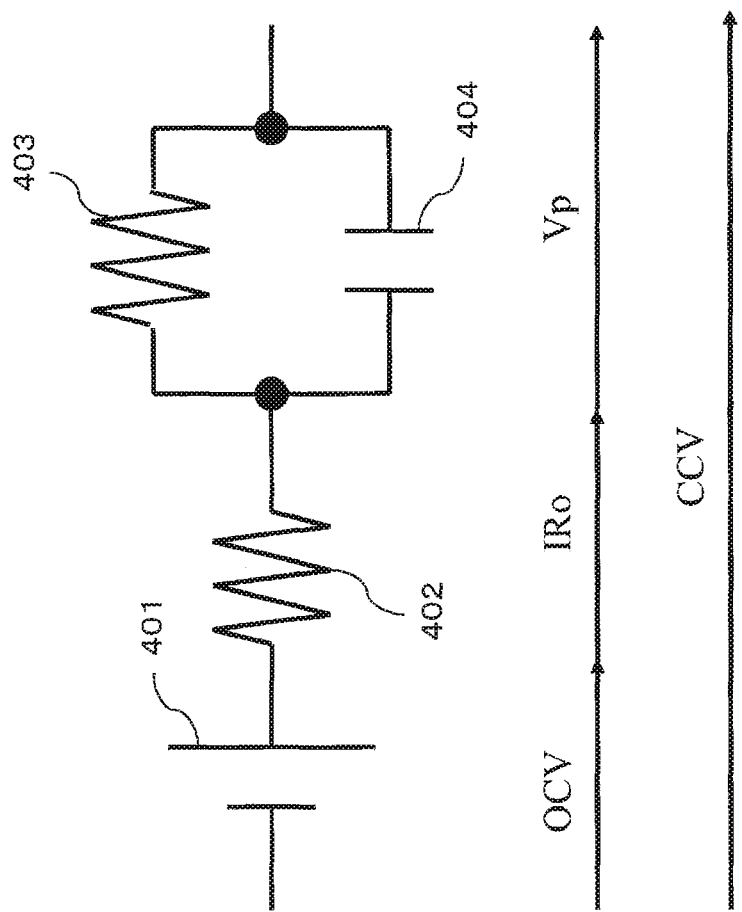
FIG. 4 is a circuit diagram illustrating an equivalent circuit of a single cell.

FIG. 4 is a circuit diagram illustrating an equivalent circuit of a single cell 111. In FIG. 4, the single cell 111 includes a voltage source 401, a DC resistor 402, a polarization resistor 403, and a capacitive element 404. The polarization resistor 403 and the capacitive element 404 are connected in parallel, and the parallel-connected pair, the voltage source 401, and the DC resistor 402 are connected in series.

The resistance value of the DC resistor 402 is defined as Ro and the polarization voltage corresponding to the voltage of the parallel-connected pair of the polarization resistor 403 and the capacitive element 404 is defined as Vp, an inter-terminal voltage (a closed circuit voltage (CCV)) of the single cell 111 when the current I is applied to the single cell 111 is expressed by Equation (1) described below. In Equation (1), OCV denotes a voltage across the voltage source 401. The OCV corresponds to the inter-terminal voltage of the single cell 111 when a charging/discharging current does not flow and the voltage thereof is temporally constant.

$$CCV = OCV + I \times Ro + Vp \quad (1)$$

The OCV is used to calculate the SOC (State Of Charge), but the OCV cannot be directly measured in a situation in which the single cell 111 is charged or discharged. Accordingly, the OCV is calculated by subtracting an IR drop and the polarization voltage Vp from the CCV using Equation (2) described below which is acquired by modifying Equation (1).

$$OCV = CCV - I \times Ro - Vp \quad (2)$$

The resistance value Ro of the DC resistor 402 and the polarization voltage Vp can be determined by characteristic information extracted from the single cell 111. The characteristic information of the single cell 111 is values acquired experimentally by performing charging and discharging of the single cell 111 and is stored in the storage unit 180 in advance. By changing the characteristic information which is used to determine the resistance value Ro of the DC resistor 402 and the polarization voltage Vp depending on the SOC, the temperature, the current, or the like of the single cell 111, it is possible to acquire the OCV with high precision. The inter-terminal voltage CCV employs a voltage obtained by dividing the measurement result of the voltage detecting unit 140 by the number of series of the single cells 111, and the current I is obtained from the measurement result of the current detecting unit 130.

Figure 5:
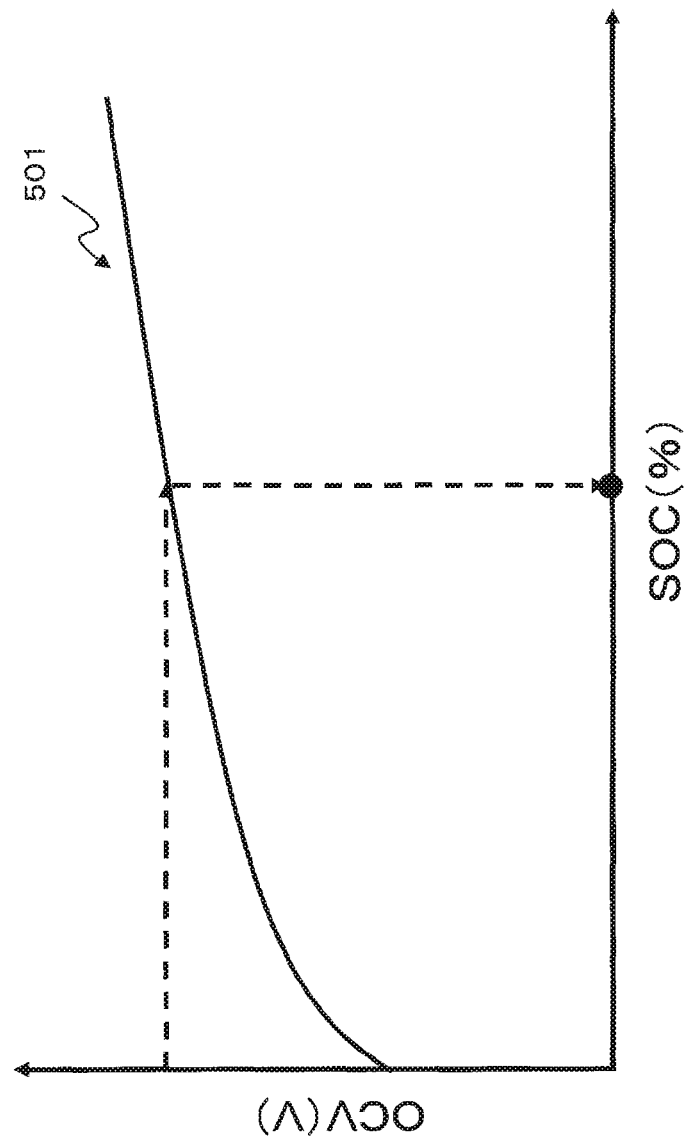
FIG. 5 is a diagram illustrating an example of an SOC table which is stored in a storage unit.

FIG. 5 is a diagram illustrating an example of an SOC table 501 which is stored in the storage unit 180. The SOC table 501 is a data table in which a correspondence between the OCV of the single cell 111 and the SOC of the single cell 111 is described. The data format thereof is arbitrary, but the table is illustrated in a graph format herein for the purpose of explanation. In this embodiment, the data table is used, but the correspondence between the OCV and the SOC may be expressed using a numerical expression or the like. Another method may be used as long as it can convert the OCV to the SOC or convert the SOC to the OCV. When the OCV is calculated using Equation (2), the SOC of the single cell 111 can be estimated using the SOC table 501.

The SOC estimating process based on a current will be described below as another example of the processing details for estimating the SOC, which is performed by the SOC calculating unit 301. The SOC calculating unit 301 may estimate the SOC of the single cell 111 using Equation (3) described below. In Equation (3), SOC0 denotes an initial value of the SOC before charging or discharging of the single cell 111, and the current I denotes a value measured by the current detecting unit 130. Qmax denotes a full-charged capacity of the single cell 111, which is a value acquired experimentally by charging and discharging the single cell 111 or the assembled battery 110 and is stored in the storage unit 180 in advance.

$$SOCi = SOC0 + 100 \times \int I dt / Qmax \qquad (3)$$

The SOC calculating unit 301 may detect the SOC using any of Equation (2) and Equation (3).

The permissible current calculating unit 302 in FIG. 3 will be described below. The permissible current calculating unit 302 has a function of calculating the permissible current of the assembled battery 110 (the single cell 111) on the basis of the voltage acquired by dividing the inter-terminal voltage of the assembled battery 110 measured by the voltage detecting unit 140 by the number of series of the single cells 111, the current measured by the current detecting unit 130, the temperature measured by the temperature detecting unit 125, and the SOC acquired by the SOC calculating unit 301. The permissible current is a maximum value of a chargeable/dischargeable current of the assembled battery 110 (the single cell 111) and is classified into a permissible charging current in charging and a permissible discharging current in discharging.

Figure 6:
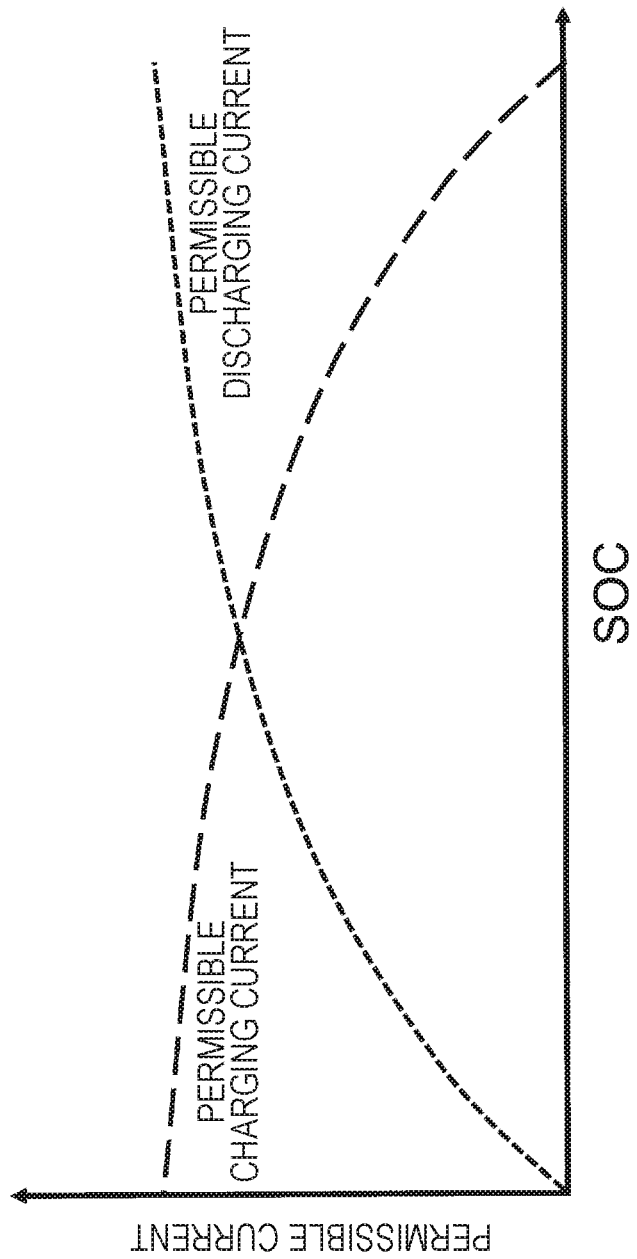
FIG. 6 is a diagram illustrating a relationship between a permissible charging current and a permissible discharging current.

FIG. 6 is a diagram illustrating a relationship between the permissible charging current and the permissible discharging current. As illustrated in FIG. 6, when the SOC of the single cell 111 is high, the permissible discharging current is large and the permissible charging current is small. On the contrary, when the SOC of the single cell 111 is low, the permissible discharging current is small and the permissible charging current is large. The permissible current calculated by the permissible current calculating unit 302 along with the SOC calculated by the SOC calculating unit 301 is transmitted to an external controller (the vehicle control unit 200 in this embodiment). The external controller performs charging and discharging of the assembled battery 110 within the range of the permissible current.

Figure 7:
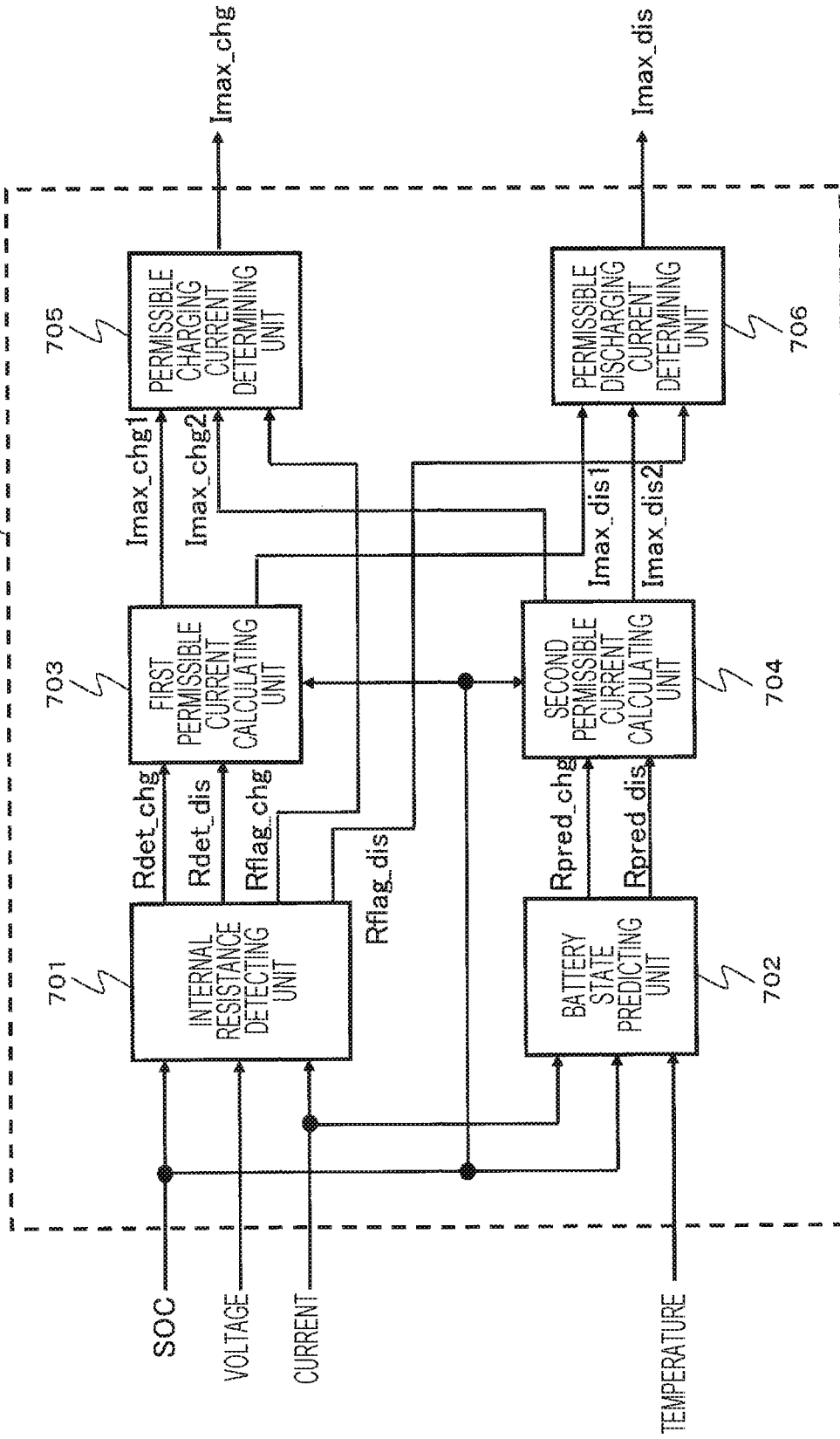
FIG. 7 is a block diagram illustrating a permissible current calculating unit according to the first embodiment of the present invention.

FIG. 7 is a block diagram illustrating the permissible current calculating unit 302 according to the first embodiment of the present invention. The permissible current calculating unit 302 includes an internal resistance detecting unit 701, a battery state predicting unit 702, a first permissible current calculating unit 703, a second permissible current calculating unit 704, a permissible charging current determining unit 705, and a permissible discharging current determining unit 706. In the battery system 100 illustrated in FIG. 1, the assembled battery control unit 150 can be made to function as the units illustrated in FIG. 7 by causing the assembled battery control unit 150 constituted by a microcomputer or the like to execute a predetermined program.

The internal resistance detecting unit 701 calculates a current internal resistance value of the assembled battery 110 using the SOC estimated by the SOC calculating unit 301 illustrated in FIG. 3, the voltage measured by the voltage detecting unit 140, and the current measured by the current detecting unit 130. Specifically, the current internal resistance value of the assembled battery 110 can be calculated by dividing a difference between the CCV in charging/discharging acquired from the value measured by the voltage detecting unit 140 as described above and the OCV acquired from the SOC by the current I measured by the current detecting unit 130 using Equations (4) and (5) described below. In Equation (4), OCV_SOC denotes an OCV value acquired from the estimation result of the SOC using the SOC table 501 illustrated in FIG. 5.

$$VDdet = CCV - OCV\_SOC \qquad (4)$$

$$Rdet = VDdet / I \qquad (5)$$

Figure 8:
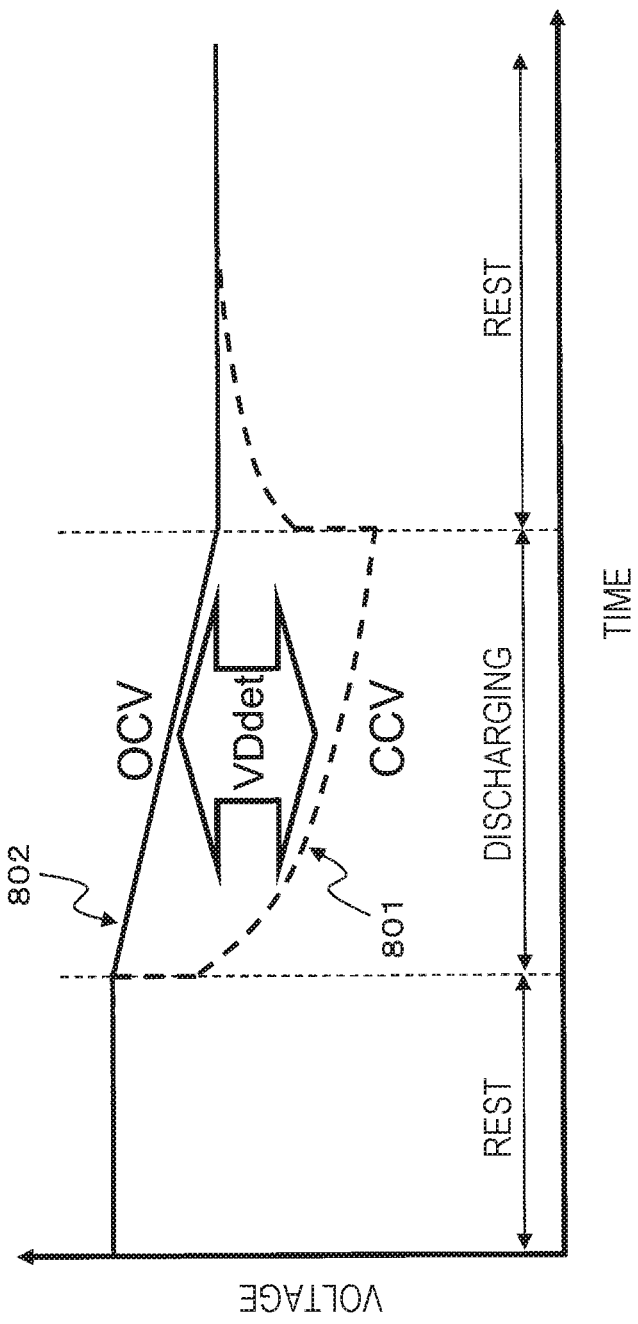
FIG. 8 is a diagram illustrating a method of calculating an internal resistance value by an internal resistance detecting unit.

FIG. 8 is a diagram illustrating a method of calculating the internal resistance value in the internal resistance detecting unit 701. In FIG. 8, diagrams 801 and 802 indicate variation states of the CCV and the OCV with the lapse of time when discharging of the assembled battery 110 is performed. As illustrated in FIG. 8, when the discharging of the assembled battery 110 is started, the OCV gradually decreases with the lapse of time and the CCV rapidly decreases at the time of start of the discharging and then gradually decreases. When the discharging of the assembled battery 110 is stopped, the CCV rapidly increases and then reaches the OCV after a predetermined time elapses. The internal resistance detecting unit 701 calculates the internal resistance value Rdet by calculating a difference VDdet between the OCV and the CCV in discharging illustrated in FIG. 8 using Equation (4) and dividing the difference VDdet by the current I using Equation (5).

The calculating of the internal resistance value by the internal resistance detecting unit 701 is performed only when the measured current value measured by the current detecting unit 130 is equal to or greater than a predetermined threshold value. When a charging current equal to or greater than the threshold value is detected, the internal resistance detecting unit 701 substitutes the value Rdet acquired using Equations (4) and (5) into the internal resistance value in charging Rdet_chg and sets a charging flag Rflag_chg indicating whether the internal resistance value in charging of the assembled battery 110 is detectable to "1." On the other hand, a predetermined invalid value or a predetermined internal resistance value is substituted for the internal resistance value in discharging Rdet_dis and a discharging flag Rflag_dis indicating whether the internal resistance value of the assembled battery 110 in discharging is detectable is set to "0."

On the contrary, when a discharging current equal to or greater than the threshold value is detected, the internal resistance detecting unit 701 substitutes the value Rdet acquired using Equations (4) and (5) for the internal resistance value in discharging Rdet_dis and sets the charging flag Rflag_dis to "1." On the other hand, a predetermined invalid value or a predetermined internal resistance value is substituted for the internal resistance value in charging Rdet_chg and the charging flag Rflag_chg is set to "0."

When a current less than the threshold value is detected, the internal resistance detecting unit 701 cannot calculate any of the internal resistance value in charging Rdet_chg and the internal resistance value in discharging Rdet_dis. In this case, the internal resistance detecting unit 701 substitutes a predetermined invalid value or a predetermined internal resistance value for the internal resistance value in charging Rdet_chg and the internal resistance value in discharging Rdet_dis and sets both the charging flag Rflag_chg and the discharging flag Rflag_dis to "0."

The voltage which is used by the internal resistance detecting unit 701 is a voltage obtained by dividing the inter-terminal voltage of the assembled battery 110 measured by the voltage detecting unit 140 by the number of series of the single cells 111. Accordingly, the internal resistance value acquired by the calculation is an average internal resistance value of the single cells 111 constituting the assembled battery 110. The permissible current is calculated using the internal resistance value, but the voltage to be treated needs to be set to a value corresponding to the single cell 111.

The battery state predicting unit 702 will be described below. The battery state predicting unit 702 has a function of predicting the state of the assembled battery 110 without using the voltage (CCV) measured by the voltage detecting unit 140. The battery state predicting unit 702 outputs a predicted internal resistance value in charging Rpred_chg and a predicted internal resistance value in discharging Rpred_dis of the assembled battery 110 as battery characteristic information indicating the prediction result of the battery state.

In the battery state predicting unit 702, the predicted internal resistance value in charging Rpred_chg and the predicted internal resistance value in discharging Rpred_dis can be estimated from the temperature acquired from the SOC estimated by the SOC calculating unit 301 illustrated in FIG. 3 or the temperature detecting unit 125 illustrated in FIG. 2. This configuration can be embodied by testing charging and discharging of the assembled battery 110 or the single cell 111 to extract resistance characteristics and storing the extraction result as a resistance characteristic table depending on the SOC and the temperature in the storage unit 180.

Figure 9:
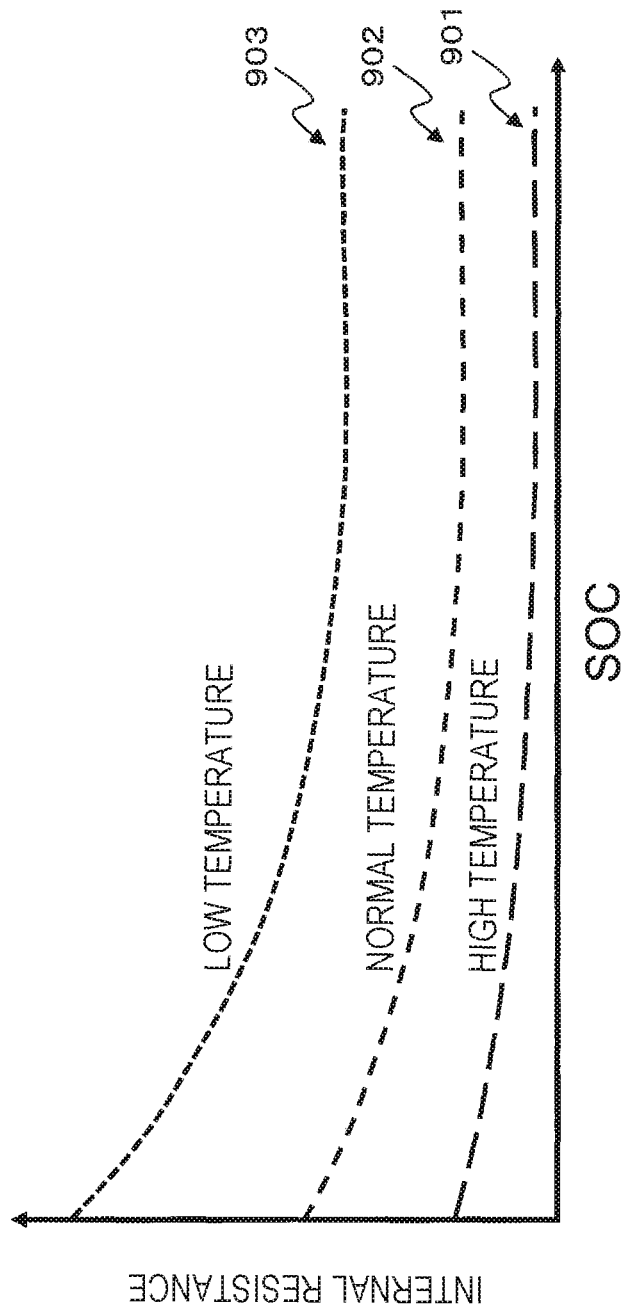
FIG. 9 is a diagram illustrating an example of a resistance characteristic table which is stored in a storage unit.

FIG. 9 is a diagram illustrating an example of the resistance characteristic tables 901, 902, and 903 stored in the storage unit 180. These tables are data tables in which a correspondence between the internal resistance of the assembled battery 110 and the SOC of the assembled battery 110, where the resistance characteristic table 901 indicates characteristics at a high temperature, the resistance characteristic table 902 indicates characteristics at a normal temperature, and the resistance characteristic table 903 indicates characteristics at a low temperature. The data format thereof is arbitrary, but the tables are described in a graph format herein for the purpose of convenience of explanation. In this embodiment, three types of data tables depending on the temperature are used, but the correspondence between the internal resistance, the SOC, and the temperature may be expressed using numerical expressions or the like.

The battery state predicting unit 702 estimates the predicted internal resistance value in charging Rpred_chg and the predicted internal resistance value in discharging Rpred_dis from the temperature acquired from the SOC estimated by the SOC calculating unit 301 illustrated in FIG. 3 or the temperature acquired from the temperature detecting unit 125 illustrated in FIG. 2 using the resistance characteristic tables. The method of predicting the internal resistance is an example, and the internal resistance may be predicted using the following method. That is, a predicted voltage drop value (VDpred) on a charging side when the battery is charged and on a discharging side when the battery discharges is calculated using Equation (6). Here, I denotes a present charging/discharging current, ROpred denotes a resistance characteristic table value of the DC resistor 402 having a value depending on the SOC, the temperature, or the like, and VPpred denotes a result obtained by predicting a polarization voltage, which is generated by connecting the polarization resistor 403 and the capacitive element 404 in parallel, by calculation. The prediction of the polarization voltage can be embodied by performing a charging and discharging test of the assembled battery 110 or the single cell 111, extracting characteristics of the polarization resistor 403 and characteristics of the capacitive element 404 (or time constant characteristics acquired by multiplying the value of the polarization resistor 403 and the value of the capacitive element 404) in advance, and calculating a voltage varying when the polarization resistor 403 and the capacitive element 404 are connected in parallel. By dividing the calculated voltage VDpred by the charging/discharging current I as expressed by Equation (5), the predicted internal resistance value Rpred_chg for charging or the predicted internal resistance value Rpred_dis for discharging can be calculated in a format close to the internal resistance detecting unit 701. The predicted internal resistance value Rpred_chg for charging or the predicted internal resistance value Rpred_dis for discharging are estimated using the resistance characteristic tables described with reference to FIG. 9 without using Equations (5) and (6). When any of charging and discharging is not detected, the resistance characteristic tables described with reference to FIG. 9 are used for both the charging side and the discharging side.

$$VDpred = I \times ROpred + VPpred \tag{6}$$

As described above, the internal resistance detecting unit 701 detects the internal resistance value of the assembled battery 110 on the basis of the voltage of the assembled battery 110 detected by the voltage detecting unit 140. In order to detect the internal resistance value, it is necessary to use the voltage detection result of the assembled battery 110. Accordingly, the internal resistance detecting unit 701 has a limitation that both the internal resistance value in charging Rdet_chg and the internal resistance value in discharging Rdet_dis cannot be calculated simultaneously. That is, as described above, the internal resistance value in charging Rdet_chg can be calculated only at the time of charging in which the charging current flowing in the assembled battery 110 is greater than a threshold value. The internal resistance value in discharging Rdet_dis can be calculated only at the time of discharging in which the discharging current from the assembled battery 110 is greater than a threshold value.

On the other hand, the battery state predicting unit 702 estimates the internal resistance value of the assembled battery 110 using the characteristic information of the assembled battery 110 stored in advance without using the voltage of the assembled battery 110 detected by the voltage detecting unit 140. Accordingly, the predicted internal resistance value in charging Rpred_chg and the predicted internal resistance value in discharging Rpred_dis can be normally predicted regardless of the charging/discharging state of the assembled battery 110. When the characteristics of the assembled battery 110 extracted in advance are not equal to the present characteristics of the assembled battery 110, an error corresponding to the difference therebetween is included in the output of the battery state predicting unit 702.

The first permissible current calculating unit 703 and the second permissible current calculating unit 704 will be described below. The first permissible current calculating unit 703 calculates a permissible current based on the voltage of the assembled battery 110 detected by the voltage detecting unit 140. Specifically, the first permissible current calculating unit 703 calculates a permissible charging current Imax_chg1 and a permissible discharging current Imax_dis1 by Equations (7) and (8) described below using the internal resistance value in charging Rdet_chg and the internal resistance value in discharging Rdet_dis which are detected by the internal resistance detecting unit 701 on the basis of the voltage measurement result by the voltage detecting unit 140, the OCV value OCV_SOC which is acquired from the SOC estimated by the SOC calculating unit 301 illustrated in FIG. 3, and an upper-limit voltage Vmax and a lower-limit voltage Vmin which are determined from the characteristics of the assembled battery 110.

$$Imax\_chg1=(Vmax-OCV\_SOC)/Rdet\_chg \quad (7)$$

$$Imax\_dis1=(Vmin-OCV\_SOC)/Rdet\_dis \quad (8)$$

Figure 10:
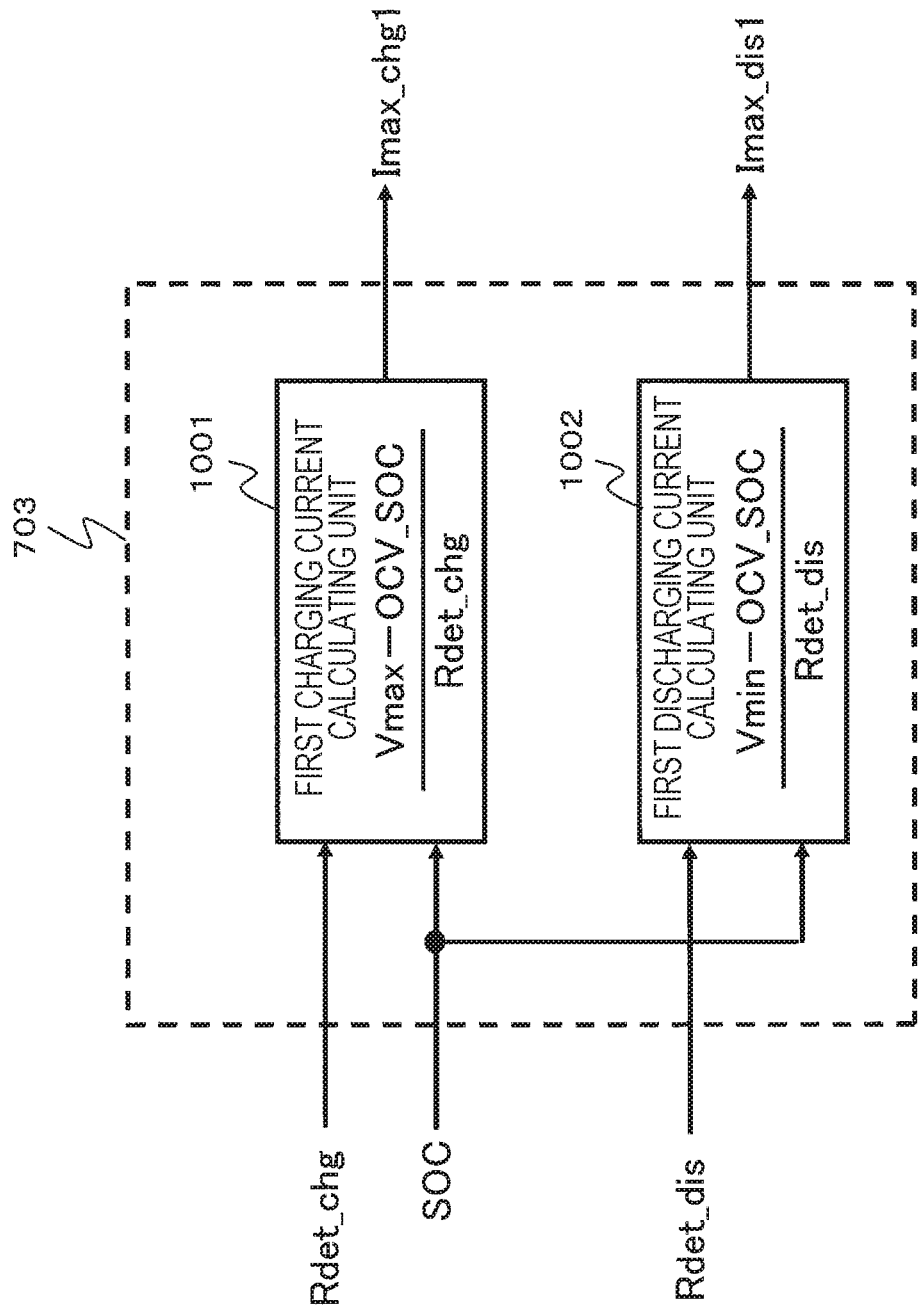
FIG. 10 is a block diagram illustrating a calculation process which is performed by a first permissible current calculating unit.

FIG. 10 is a block diagram illustrating a calculation process which is performed by the first permissible current calculating unit 703. In FIG. 10, the first permissible current calculating unit 703 includes a first charging current calculating unit 1001 corresponding to the calculation of Equation (7) and a first discharging current calculating unit 1002 corresponding to the calculation of Equation (8). The first charging current calculating unit 1001 calculates and outputs the permissible charging current Imax_chg1 by Equation (7) using the internal resistance value in charging Rdet_chg input from the internal resistance detecting unit 701 and the SOC input from the SOC calculating unit 301. The first discharging current calculating unit 1002 calculates and outputs the permissible discharging current Imax_dis1 by Equation (8) using the internal resistance value in discharging Rdet_dis input from the internal resistance detecting unit 701 and the SOC input from the SOC calculating unit 301.

As described above, the internal resistance detecting unit 701 can calculate the internal resistance value Rdet_chg only in charging and can calculate the internal resistance value Rdet_dis only in discharging. Accordingly, the first permissible current calculating unit 703 has a limitation that the permissible charging current Imax_chg1 can be calculated only in charging and the permissible discharging current Imax_dis1 can be calculated only in discharging.

The first permissible current calculating unit 703 calculates the permissible charging current Imax_chg1 and the permissible discharging current Imax_dis1 using the voltage detection result by the voltage detecting unit 140. On the other hand, the second permissible current calculating unit 704 calculates the permissible current of the assembled battery 110 without using the voltage of the assembled battery 110 detected by the voltage detecting unit 140. Specifically, a permissible charging current Imax_chg2 and a permissible discharging current Imax_dis2 are calculated by Equations (9) and (10) described below using the predicted internal resistance value in charging Rpred_chg and the predicted internal resistance value in discharging Rpred_dis which are predicted by the battery state predicting unit 702, the OCV value OCV_SOC which is acquired from the SOC estimated by the SOC calculating unit 301 illustrated in FIG. 3, and the upper-limit voltage Vmax and the lower-limit voltage Vmin which are determined from the characteristics of the assembled battery 110 without using the voltage detection result by the voltage detecting unit 140.

$$Imax\_chg2=(Vmax-OCV\_SOC)/Rpred\_chg \quad (9)$$

$$Imax\_dis2=(Vmin-OCV\_SOC)/Rpred\_dis \quad (10)$$

Figure 11:
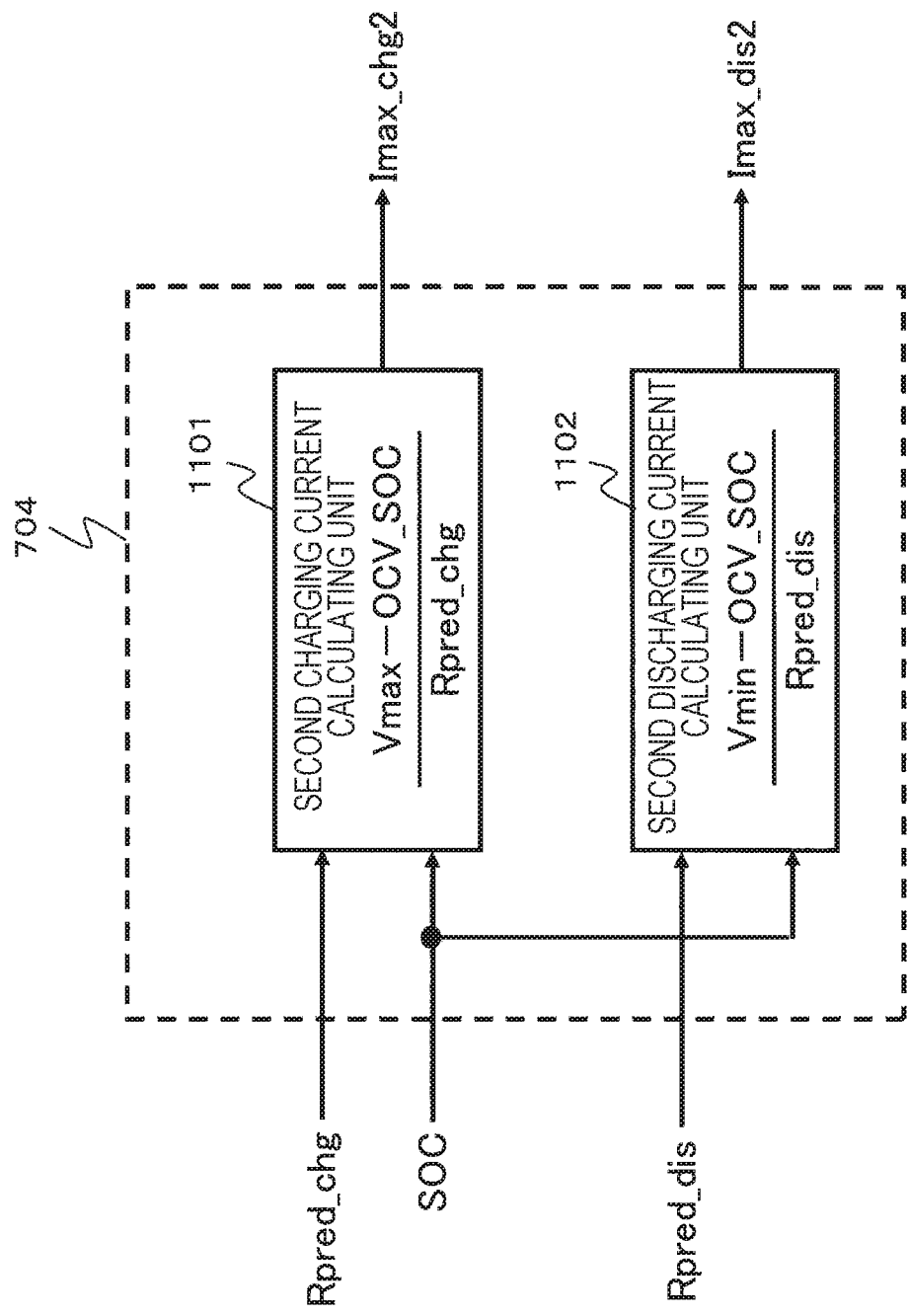
FIG. 11 is a block diagram illustrating a calculation process which is performed by a second permissible current calculating unit.

FIG. 11 is a block diagram illustrating a calculation process which is performed by the second permissible current calculating unit 704. In FIG. 11, the second permissible current calculating unit 704 includes a second charging current calculating unit 1101 corresponding to the calculation of Equation (9) and a second discharging current calculating unit 1102 corresponding to Equation (10). The second charging current calculating unit 1101 calculates and outputs a permissible charging current Imax_chg2 by Equation (9) using the internal resistance value in charging Rpred_chg input from the battery state predicting unit 702 and the SOC input from the SOC calculating unit 301. The second discharging current calculating unit 1102 calculates and outputs a permissible discharging current Imax_dis2 by Equation (10) using the internal resistance value in discharging Rpred_dis input from the battery state predicting unit 702 and the SOC input from the SOC calculating unit 301.

As described above, the battery state predicting unit 702 can normally calculate the internal resistance value in charging Rpred_chg and the internal resistance value in discharging Rpred_dis regardless of the charging/discharging state of the assembled battery 110. Accordingly, the second permissible current calculating unit 704 can normally calculate the permissible charging current Imax_chg2 and the permissible discharging current Imax_dis2 regardless of the charging/discharging state of the assembled battery 110. Here, when the characteristics of the assembled battery 110 extracted in advance do not match the present characteristics of the assembled battery 110, the output from the battery state predicting unit 702 may include an error corresponding to the difference therebetween as described above. Accordingly, the permissible charging current Imax_chg2 and the permissible discharging current Imax_dis2 output from the second permissible current calculating unit 704 may also include a permissible current error corresponding to the error.

As described above, the first permissible current calculating unit 703 has a limitation of calculation conditions that the permissible current can be calculated only when the assembled battery 110 is subjected to charging or discharging, but the second permissible current calculating unit 704 does not has such a limitation. Here, in the permissible current calculated by the second permissible current calculating unit 704, an error occurs when the battery characteristics extracted in advance do not match the present battery characteristics. Therefore, in this embodiment, when a condition that the first permissible current calculating unit 703 can calculate the permissible current is satisfied, that is, when the charging/discharging current of the assembled battery 110 is equal to or greater than a predetermined threshold value, the permissible current calculating unit 302 determines the output from the first permissible current calculating unit 703 to be a final permissible current of the assembled battery 110. On the other hand, when the condition that the first permissible current calculating unit 703 can calculate the permissible current is not satisfied, that is, when the charging/discharging current of the assembled battery 110 is less than a predetermined threshold value, the permissible current calculating unit determines the output from the second permissible current calculating unit 704 to be the final permissible current of the assembled battery 110. In order to realize this process, the permissible current calculating unit 302 includes the permissible charging current determining unit 705 and the permissible discharging current determining unit 706.

The permissible charging current determining unit 705 determines and outputs a final permissible charging current Imax_chg on the basis of the permissible charging current Imax_chg1 calculated by the first permissible current calculating unit 703 and the permissible charging current Imax_chg2 calculated by the second permissible current calculating unit 704. Specifically, on the basis of the charging flag Rflag_chg output from the internal resistance detecting unit 701, anyone of the permissible charging current Imax_chg1 and the permissible charging current Imax_chg2 is selected and output as the permissible charging current Imax_chg.

The permissible discharging current determining unit 706 determines and outputs a final permissible discharging current Imax_dis on the basis of the permissible discharging current Imax_dis1 calculated by the first permissible current calculating unit 703 and the permissible discharging current Imax_dis2 calculated by the second permissible current calculating unit 704. Specifically, on the basis of the value of the discharging flag Rflag_dis output from the internal resistance detecting unit 701, any one of the permissible discharging current Imax_dis1 and the permissible discharging current Imax_dis2 is selected and output as the permissible discharging current Imax_dis.

Figure 12:
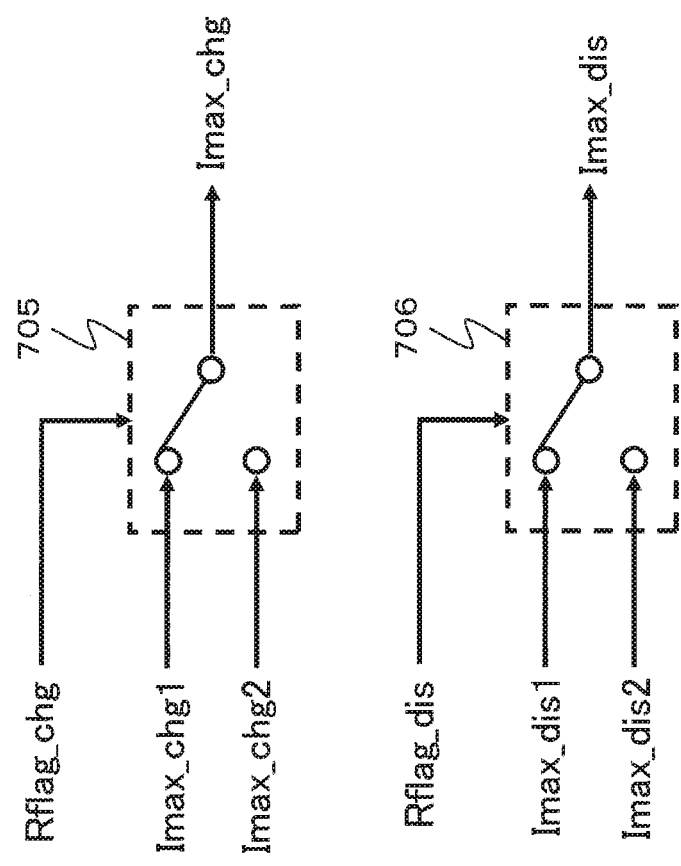
FIG. 12 is a diagram illustrating an example of a block diagram of calculation processes which are performed by a permissible charging current determining unit and a permissible discharging current determining unit according to the first embodiment of the present invention.

FIG. 12 is a diagram illustrating an example of a block diagram of calculation processes which are performed by the permissible charging current determining unit 705 and the permissible discharging current determining unit 706 according to the first embodiment of the present invention. In FIG. 12, the permissible charging current determining unit 705 which is embodied by a switch selects the permissible charging current Imax_chg1 output from the first permissible current calculating unit 703 when the charging flag Rflag_chg is "1," and selects the permissible charging current Imax_chg2 output from the second permissible current calculating unit 704 when the charging flag Rflag_chg is "0." Similarly, the permissible discharging current determining unit 706 which is embodied by a switch selects the permissible discharging current Imax_dis1 output from the first permissible current calculating unit 703 when the discharging flag Rflag_dis is "1," and selects the permissible discharging current Imax_dis2 output from the second permissible current calculating unit 704 when the discharging flag Rflag_dis is "0."

Figure 13:
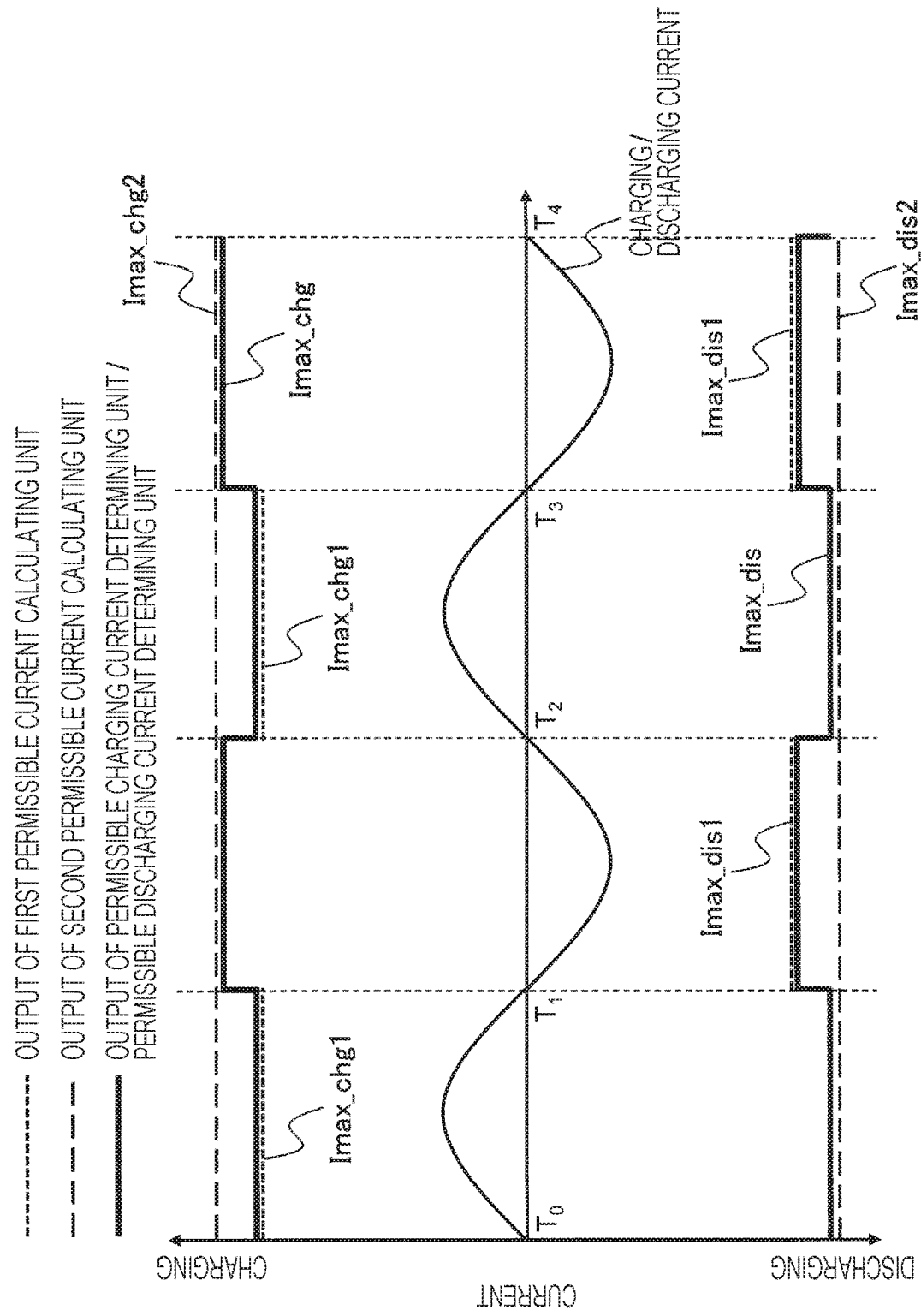
FIG. 13 is a diagram illustrating a state of a permissible current which is finally output from the permissible current calculating unit according to the first embodiment of the present invention.

FIG. 13 is a diagram illustrating a state of the permissible current which is finally output from the permissible current calculating unit 302 according to the first embodiment of the present invention. Here, for the purpose of simplification of explanation, the charging/discharging current varies in a sinusoidal shape of a constant period as illustrated in the drawing, a case in which the current value is positive is defined as charging, and a case in which the current value is negative is defined as discharging. It is assumed that the charging flag Rflag_chg is set to "1" immediately when the direction of the current is a charging direction, and the discharging flag Rflag_dis is set to "1" immediately when the direction of the current is a discharging direction.

When the charging/discharging current flows in the charging direction, the internal resistance detecting unit 701 can calculate the internal resistance value in charging Rdet_chg, and the first permissible current calculating unit 703 can calculate the permissible charging current Imax_chg1 using the calculated internal resistance value. On the other hand, since the internal resistance value in charging Rpred_chg predicted by the battery state predicting unit 702 is estimated from the battery characteristics stored in advance, the permissible charging current Imax_chg2 calculated by the second permissible current calculating unit 704 using the predicted internal resistance value has an error larger than that of the permissible charging current Imax_chg1. Therefore, when the direction of the charging/discharging current is the charging direction, the permissible charging current determining unit 705 determines the permissible charging current Imax_chg1 from the first permissible current calculating unit 703 as the final permissible charging current and outputs the determined final permissible charging current as the permissible charging current Imax_chg.

In this case, since the internal resistance detecting unit 701 cannot calculate the internal resistance value in discharging Rdet_dis, the first permissible current calculating unit 703 cannot calculate the permissible discharging current Imax_dis1. On the other hand, the second permissible current calculating unit 704 can calculate the permissible discharging current Imax_dis2 using the internal resistance value in discharging Rpred_dis predicted by the battery state predicting unit 702. Therefore, when the direction of the charging/discharging current is the charging direction, the permissible discharging current determining unit 706 determines the permissible discharging current Imax_dis2 from the second permissible current calculating unit 704 as the final permissible discharging current and outputs the determined final permissible discharging current as the permissible discharging current Imax_dis.

When the charging/discharging current flows in the discharging direction, the internal resistance detecting unit 701 can calculate the internal resistance value in discharging Rdet_dis and the first permissible current calculating unit 703 can calculate the permissible discharging current Imax_dis1 using the calculated internal resistance value. On the other hand, since the internal resistance value in discharging Rpred_dis predicted by the battery state predicting unit 702 is estimated from the battery characteristics stored in advance, the permissible discharging current Imax_dis2 calculated by the second permissible current calculating unit 704 using the predicted internal resistance value has an error larger than that of the permissible discharging current Imax_dis1. Therefore, when the direction of the charging/discharging current is the discharging direction, the permissible discharging current determining unit 706 determines the permissible discharging current Imax_dis1 from the first permissible current calculating unit 703 as the final permissible discharging current and outputs the determined final permissible charging current as the permissible discharging current Imax_dis.

In this case, since the internal resistance detecting unit 701 cannot calculate the internal resistance value in charging Rdet_chg, the first permissible current calculating unit 703 cannot calculate the permissible charging current Imax_chg1. On the other hand, the second permissible current calculating unit 704 can calculate the permissible charging current Imax_chg2 using the internal resistance value in charging Rpred_chg predicted by the battery state predicting unit 702. Therefore, when the direction of the charging/discharging current is the discharging direction, the permissible charging current determining unit 705 determines the permissible charging current Imax_chg2 from the second permissible current calculating unit 704 as the final permissible charging current and outputs the determined final permissible charging current as the permissible charging current Imax_chg.

In other words, the permissible charging current determining unit 705 determines and outputs the permissible charging current Imax_chg2 calculated by the second permissible current calculating unit 704 as the final permissible charging current Imax_chg of the assembled battery 110, in discharging before the charging of the assembled battery 110 is started. After the charging of the assembled battery 110 is started, the permissible charging current Imax_chg is switched from the permissible charging current Imax_chg2 calculated by the second permissible current calculating unit 704 to the permissible charging current Imax_chg1 with a smaller error calculated by the first permissible current calculating unit 703. On the other hand, the permissible discharging current determining unit 706 determines and outputs the permissible discharging current Imax_dis2 calculated by the second permissible current calculating unit 704 as the final permissible discharging current Imax_dis of the assembled battery 110, in charging before the discharging of the assembled battery 110 is started. After the discharging of the assembled battery 110 is started, the permissible discharging current Imax_dis is switched from the permissible discharging current Imax_dis2 calculated by the second permissible current calculating unit 704 to the permissible discharging current Imax_dis1 with a smaller error calculated by the first permissible current calculating unit 703.

The processing details of the calculation of the permissible current in the present invention have been described hitherto using the block diagram of the permissible current calculating unit 302 illustrated in FIG. 7. FIG. 7 is an example and processing details when the present invention is embodied by another permissible current calculating unit 302 will be described below.

Figure 14:
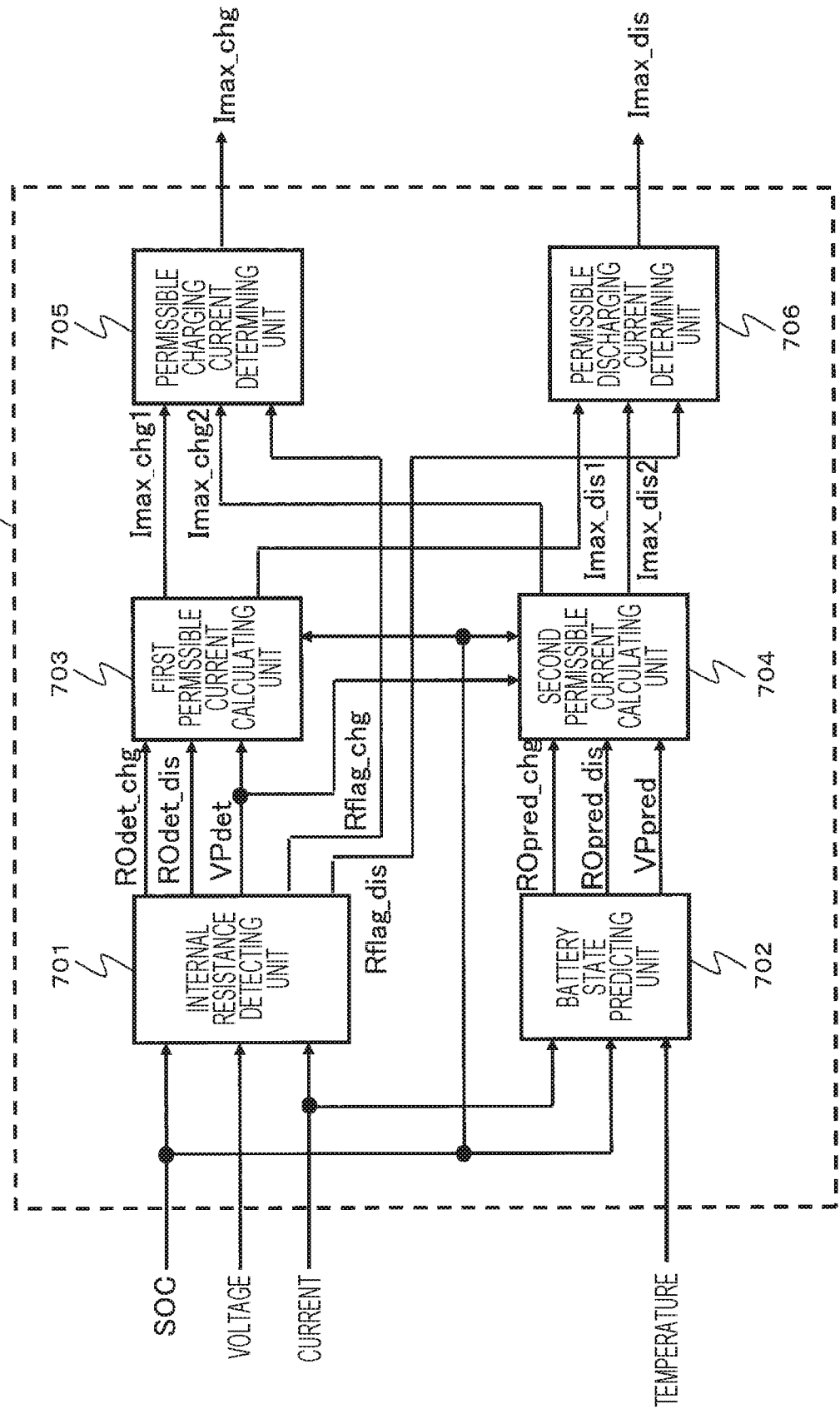
FIG. 14 is a block diagram illustrating the permissible current calculating unit according to the first embodiment of the present invention.

FIG. 14 illustrates a block diagram of the permissible current calculating unit 302 which is different from FIG. 7. The internal resistance detecting unit 701 illustrated in FIG. 7 outputs the detected internal resistance values Rdet_chg and Rdet_dis and the charging flag Rflag_chg and the discharging flag Rflag_dis indicating whether the internal resistance value is detectable. The internal resistance detecting unit 701 illustrated in FIG. 14 outputs the detected DC resistance values ROdet_chg and ROdet_dis, the detected polarization voltage VPdet, and the charging flag Rflag_chg and the discharging flag Rflag_dis indicating whether the battery information is detectable. The output of the battery state predicting unit 702 illustrated in FIG. 7 is the predicted internal resistance values Rpred_chg and Rpred_dis, but predicted DC resistance values ROpred_chg and ROpred_dis and predicted polarization voltage value VPpred are output in FIG. 14.

The processing details of the internal resistance detecting unit 701 illustrated in FIG. 14 will be described below. The internal resistance detecting unit 701 detects a present DC resistance value of the assembled battery 110 using the voltage measured by the voltage detecting unit 140 and the current measured by the current detecting unit 130. Specifically, the DC resistance value is calculated using Equation (11) described below. In Equation (11), t denotes the time, V(t) denotes the voltage measured by the voltage detecting unit 140 at time t, and I(t) denotes the value of the current measured by the current detecting unit 130 at time t.

$$ROdet=(V(t)-V(t-1))/(I(t)-I(t-1)) \quad (11)$$

The DC resistance value acquired from Equation (11) may be unstable depending on measuring performance of the voltage detecting unit 140 and the current detecting unit 130 or the conditions in which Equation (11) is carried out. Therefore, The DC resistance values ROdet acquired by carrying out Equation (11) plural times are averaged and then the average value can be used for subsequent calculations, if necessary.

The DC resistance value ROdet acquired when I(t) and I(t−1) in Equation (11) are current values in charging can be considered as the DC resistance values in charging. Therefore, the DC resistance value ROdet acquired under this condition is substituted for the DC resistance value in charging ROdet_chg and the charging flag Rflag_chg indicating whether the DC resistance value in charging of the assembled battery 110 is detectable is set to "1." On the other hand, a predetermined invalid value or a predetermined DC resistance value is substituted for the DC resistance value in discharging ROdet_dis and the discharging flag Rflag_dis indicating whether the DC resistance value in discharging of the assembled battery 110 is detectable is set to "0." The DC resistance of the assembled battery 110 does not vary greatly for a short time. Accordingly, when the DC resistance value in discharging ROdet_dis cannot be calculated, the DC resistance value in discharging ROdet_dis which has been previously calculated may be used. When the DC resistance value in discharging ROdet_dis cannot be calculated in a predetermined time or more, the discharging flag Rflag_dis is set to "0."

On the contrary, when I(t) and I(t−1) in Equation (11) are current values in discharging, the internal resistance detecting unit 701 substitutes the acquired value of ROdet for ROdet_dis and sets the discharging flag Rflag_dis to "1." On the other hand, a predetermined invalid value or a predetermined DC resistance value is substituted for ROdet_chg and the charging flag Rflag_chg is set to "0." As described above, the DC resistance of the assembled battery 110 does not vary greatly for a short time. Accordingly, when the DC resistance value in charging ROdet_chg cannot be calculated, the DC resistance value in charging ROdet_chg which has been previously calculated may be used. When the DC resistance value in charging ROdet_chg cannot be calculated in a predetermined time or more, the charging flag Rflag_chg is set to "0."

When I(t) and I(t−1) constitutes a pair in charging and discharging, or when a difference between I(t) and I(t−1) is less than a threshold value and it is difficult to detect a DC resistance, the internal resistance detecting unit 701 cannot calculate any of the DC resistance value in charging ROdet_chg and the DC resistance value in discharging ROdet_dis. In this case, the internal resistance detecting unit 701 substitutes a predetermined invalid value or a predetermined DC resistance value for ROdet_chg and ROdet_dis and sets both the charging flag Rflag_chg and the discharging flag Rflag_dis to "0." Alternatively, the DC resistance value in charging ROdet_chg and the DC resistance value in discharging ROdet_dis which have been previously calculated are used when the DC resistance value in charging ROdet_chg and the DC resistance value in discharging ROdet_dis cannot be calculated, and both the charging flag Rflag_chg and the discharging flag Rflag_dis are set to "0" when the DC resistance value in charging ROdet_chg and the DC resistance value in discharging ROdet_dis cannot be calculated in a predetermined time or more.

By the above-mentioned process, the internal resistance detecting unit 701 detects the DC resistance value of the assembled battery 110. In addition, the internal resistance detecting unit 701 detects the polarization voltage of the assembled battery 110 (VPdet). The method of detecting the polarization voltage is expressed by Equation (12).

$$VPdet=CCV-OCV\_SOC-I \times ROdet \quad (12)$$

Here, CCV denotes the voltage value in charging/discharging measured by the voltage detecting unit 140, OCV_SOC denotes the OCV value acquired from the SOC estimation result by the SOC table 501 illustrated in FIG. 5, I denotes the current value measured by the current detecting unit 130, and ROdet denotes the DC resistance in charging or discharging of the assembled battery 110 which is detected by the internal resistance detecting unit 701. The detection result of VPdet is output along with the DC resistance values ROdet_chg and ROdet_dis and the charging flag Rflag_chg and the discharging flag Rflag_dis indicating whether the battery state is detectable, and is used for calculation of the permissible current to be described later.

The battery state predicting unit 702 illustrated in FIG. 14 will be described below. As described above, the internal resistance detecting unit 701 can detect the battery state such as the DC resistance value only when a predetermined condition is satisfied. On the other hand, when the characteristics of the assembled battery 110 extracted in advance do not match the present characteristics of the assembled battery 110, the output from the battery state predicting unit 702 includes an error corresponding to the difference therebetween, but the battery state predicting unit 702 mentioned herein can normally output the battery state to the outside.

The battery state predicting unit 702 has a function of predicting a state of the assembled battery 110 without using the voltage (CCV) measured by the voltage detecting unit 140. The battery state predicting unit 702 outputs as battery characteristic information indicating a prediction result of a battery state a predicted DC resistance value in charging ROpred-chg of the assembled battery 110, a predicted DC resistance value in discharging ROpred_dis, and a predicted polarization voltage value VPpred.

In the battery state predicting unit 702, the predicted DC resistance value in charging ROpred-chg and the predicted DC resistance value in discharging ROpred_dis can be estimated from the SOC estimated by the SOC calculating unit 301 illustrated in FIG. 3 or the temperature received from the temperature detecting unit 125 illustrated in FIG. 2. This process can be realized by extracting resistance characteristics by performing a charging and discharging test of the assembled battery 110 or the single cell 111 in advance and storing the result as a resistance characteristic table depending on the SOC, the temperature, and the like in the storage unit 180. The predicted polarization voltage value VPpred can be predicted by calculating the polarization voltage generated by connecting the polarization resistor 403 and the capacitive element 404 in parallel as described in Equation (6).

Figure 15:
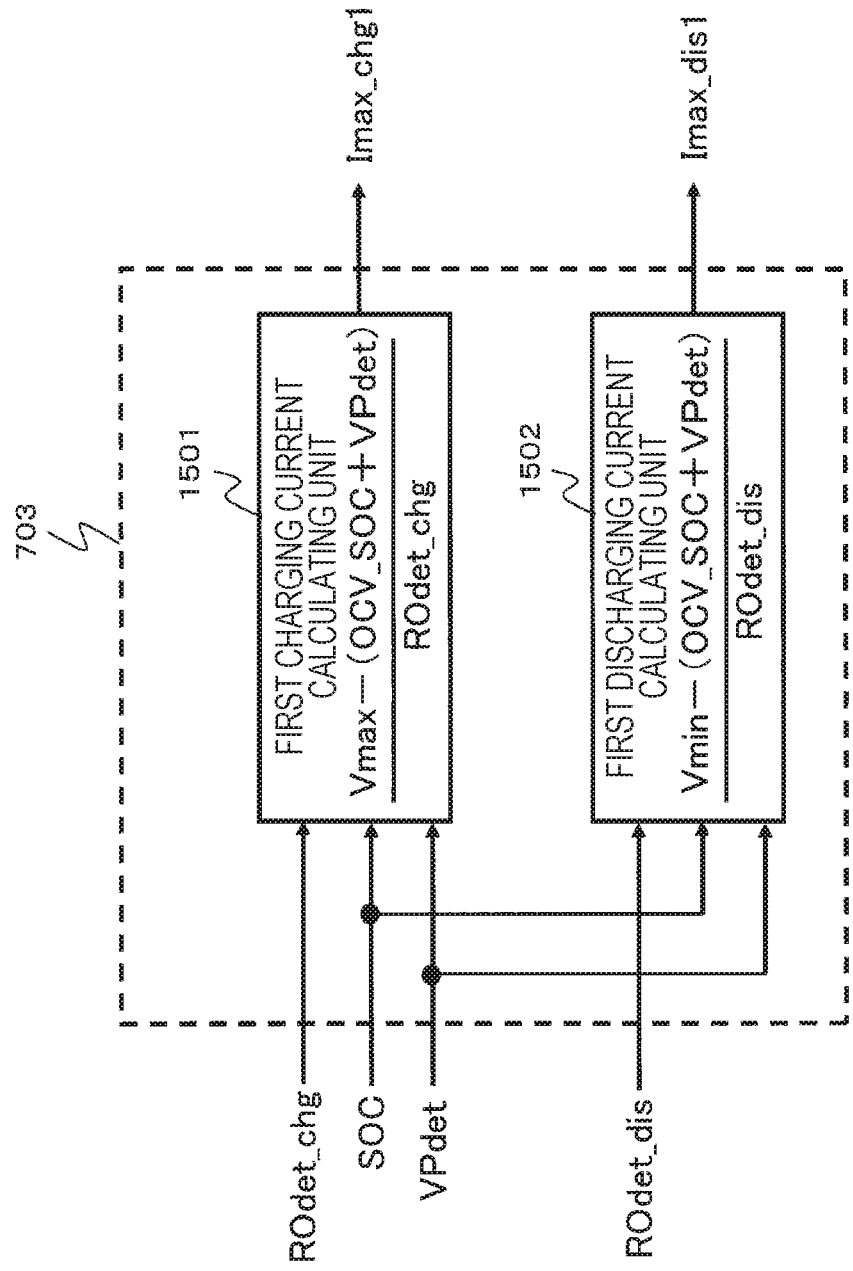
FIG. 15 is a block diagram illustrating a calculation process which is performed by the first permissible current calculating unit.

The first permissible current calculating unit 703 in FIG. 14 calculates the permissible current using the SOC, the ROdet_chg, the ROdet_dis, and the VPdet as an input. Specifically, the permissible charging current Imax_chg1 and the permissible discharging current Imax_dis1 are calculated by Equations (13) and (14) described below using the DC resistance value in charging ROdet_chg and the DC resistance value in discharging ROdet_dis which are detected by the internal resistance detecting unit 701 on the basis of the voltage measurement result by the voltage detecting unit 140, the OCV value OCV_SOC acquired from the SOC estimated by the SOC calculating unit 301 in FIG. 3, the polarization voltage VPdet detected using Equation (12), and an upper-limit voltage Vmax and a lower-limit voltage Vmin determined from the characteristics of the assembled battery 110. FIG. 15 is a block diagram of the calculation process which is performed by the first permissible current calculating unit 703. In Equations (7) and (8), the influence of the polarization voltage is included in Rdet_chg and Rdet_dis to calculate the permissible current, but the permissible current is calculated without converting the polarization voltage into a resistance value herein.

$$Imax\_chg1 = \{Vmax-(OCV\_SOC+VPdet)\}/ROdet\_chg \quad (13)$$

$$Imax\_dis1 = \{Vmin-(OCV\_SOC+VPdet)\}/ROdet\_dis \quad (14)$$

Figure 16:
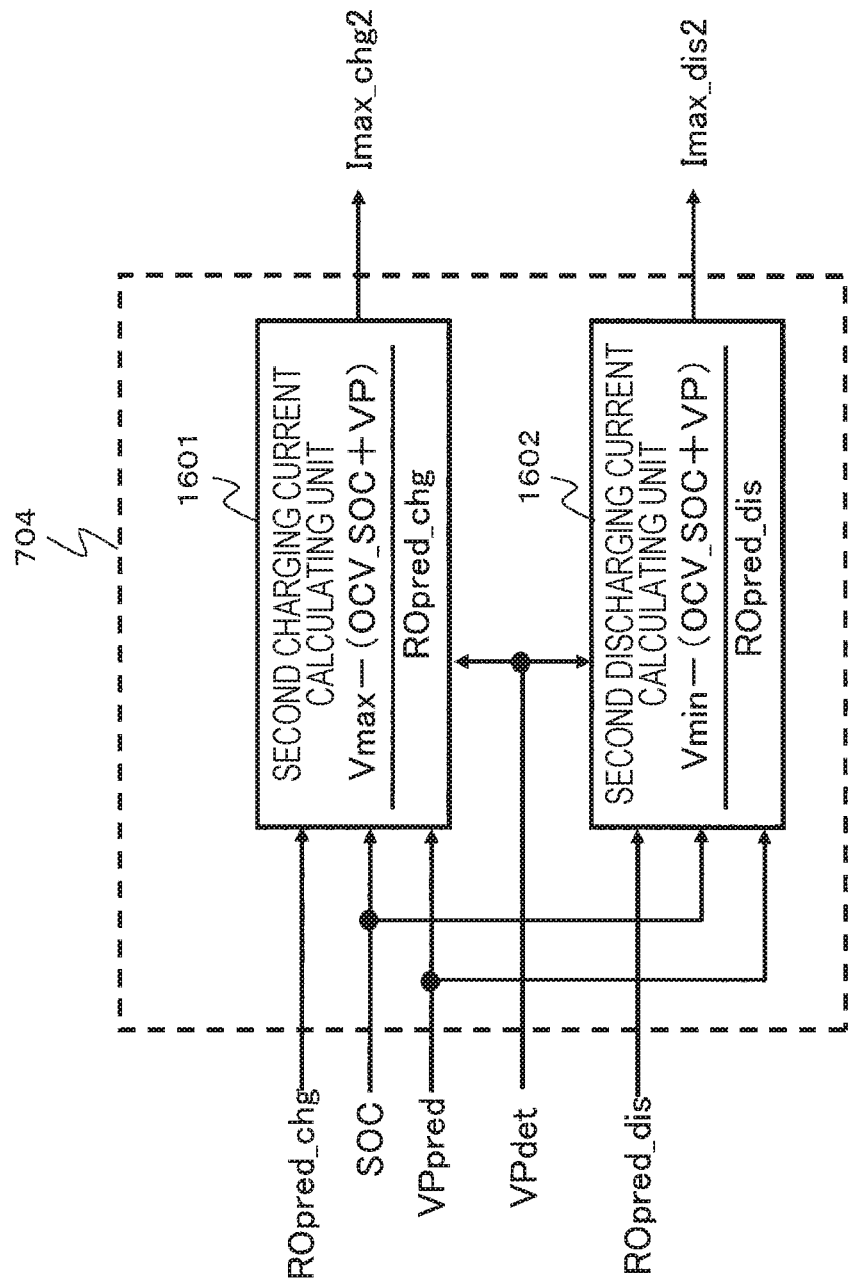
FIG. 16 is a block diagram illustrating a calculation process which is performed by the second permissible current calculating unit.

The second permissible current calculating unit 704 receives VPdet and the like which are the output from the battery state predicting unit 702 and the output from the internal resistance detecting unit 701 and calculates the permissible current of the assembled battery 110. Specifically, the permissible charging current Imax_chg2 and the permissible discharging current Imax_dis2 are calculated by Equations (15) and (16) described below using the predicted DC resistance value in charging ROpred_chg and the predicted DC resistance value in discharging ROpred_dis which are estimated, the OCV value OCV_SOC acquired from the SOC estimated by the SOC calculating unit 301 in FIG. 3, the predicted polarization voltage value VPpred which is predicted by calculation or the polarization voltage VPdet detected using Equation (12), and the upper-limit voltage Vmax and the lower-limit voltage Vmin determined from the characteristics of the assembled battery 110. FIG. 16 is a block diagram of the calculation process which is performed by the second permissible current calculating unit 704. The reason of using VPdet in addition to VPpred as an input is that the polarization voltage is a common parameter which is detected in charging but can also be used in discharging and is detected in discharging but can also be used in charging. The polarization voltage VPdet detected by the internal resistance detecting unit 701 can be used by the second permissible current calculating unit 704, the predicted polarization voltage value VPpred is used before the polarization voltage VPdet is detected by the internal resistance detecting unit 701, and a process employing the polarization voltage VPdet with priority to accuracy can be realized when the polarization voltage VPdet is detected. For the purpose of simplification of the permissible current calculating process, the second permissible current calculating unit 704 can treat only the output from the battery state predicting unit 702, that is, can employ the processing details using only the predicted polarization voltage value VPpred as the polarization voltage.

The predicted polarization voltage value VPpred or the polarization voltage VPdet detected in Equation (12) is substituted for the polarization voltage VP in Equations (15) and (16) and FIG. 16. The predicted polarization voltage value VPpred is substituted for VP when VPdet is not detected, and the polarization voltage VPdet is substituted for VP when the valid polarization voltage VPdet is detected by the internal resistance detecting unit 701, whereby the permissible charging current Imax_chg2 and the permissible discharging current Imax_dis2 are calculated.

$$Imax\_chg2 = \{Vmax-(OCV\_SOC+VP)\}/ROpred\_chg \quad (15)$$

$$Imax\_dis2 = \{Vmin-(OCV\_SOC+VP)\}/ROpred\_dis \quad (16)$$

The permissible charging current determining unit 705 and the permissible discharging current determining unit 706 in FIG. 14 are the same as the functions illustrated in FIG. 7. That is, the permissible charging current determining unit 705 selects any one of the permissible charging current Imax_chg1 and the permissible charging current Imax_chg2 on the basis of the value of the charging flag Rflag_chg output from the internal resistance detecting unit 701, and outputs the selected permissible charging current as the permissible charging current Imax_chg. The permissible discharging current determining unit 706 selects anyone of the permissible discharging current Imax_dis1 and the permissible discharging current Imax_dis2 on the basis of the value of the discharging flag Rflag_dis output from the internal resistance detecting unit 701, and outputs the selected permissible discharging current as the permissible discharging current Imax_dis. Accordingly, as described above with reference to FIG. 7, it is possible to calculate the permissible current with high precision.

According to the above-mentioned first embodiment of the present invention, the following operations and effects can be accomplished.

(1) In the assembled battery control unit 150, the permissible current calculating unit 302 includes the first permissible current calculating unit 703, the second permissible current calculating unit 704, the permissible charging current determining unit 705, and the permissible discharging current determining unit 706. The first permissible current calculating unit 703 calculates the permissible charging current Imax_chg1 and the permissible discharging current Imax_dis1 as the permissible current of the assembled battery 110 based on the voltage of the assembled battery 110 detected by the voltage detecting unit 140. The second permissible current calculating unit 704 calculates the permissible charging current Imax_chg2 and the permissible discharging current Imax_dis2 as the permissible current of the assembled battery 110 without using the voltage of the assembled battery 110. The permissible charging current determining unit 705 determines the permissible charging current Imax_chg of the assembled battery 110 corresponding to the state of the assembled battery 110 on the basis of at least one of the permissible charging current Imax_chg1 and the permissible charging current Imax_chg2, and the permissible discharging current determining unit 706 determines the permissible discharging current Imax_dis of the assembled battery 110 corresponding to the state of the assembled battery 110 on the basis of at least one of the permissible discharging current Imax_dis1 and the permissible discharging current Imax_dis2. As a result, it is possible to detect the permissible current of the assembled battery 110 with high precision.

(2) The permissible charging current determining unit 705 determines the permissible charging current Imax_chg1 to be the permissible charging current Imax_chg of the assembled battery 110 when the assembled battery 110 is in a state in which the permissible charging current Imax_chg1 can be calculated, and determines the permissible charging current Imax_chg2 to be the permissible charging current Imax_chg of the assembled battery 110 when the assembled battery 110 is in a state in which the permissible charging current Imax_chg1 cannot be calculated. Specifically, when the charging current of the assembled battery 110 is equal to or greater than a predetermined threshold value, it is determined that the assembled battery 110 is in a state in which the permissible charging current Imax_chg1 can be calculated and the permissible charging current Imax_chg1 is determined to be the permissible charging current Imax_chg of the assembled battery 110. When the charging current of the assembled battery 110 is less than the threshold value, it is determined that the assembled battery 110 is in a state in which the permissible charging current Imax_chg1 cannot be calculated and the permissible charging current Imax_chg2 is determined to be the permissible charging current Imax_chg of the assembled battery 110. The permissible discharging current determining unit 706 determines the permissible discharging current Imax_dis1 to be the permissible discharging current Imax_dis of the assembled battery 110 when the assembled battery 110 is in a state in which the permissible discharging current Imax_dis1 can be calculated, and determines the permissible discharging current Imax_dis2 to be the permissible discharging current Imax_dis of the assembled battery 110 when the assembled battery 110 is in a state in which the permissible discharging current Imax_dis1 cannot be calculated. Specifically, when the discharging current of the assembled battery 110 is equal to or greater than a predetermined threshold value, it is determined that the assembled battery 110 is in the state in which the permissible discharging current Imax_dis1 can be calculated and the permissible discharging current Imax_dis1 is determined to be the permissible discharging current Imax_dis of the assembled battery 110. When the discharging current of the assembled battery 110 is less than the threshold value, it is determined that the assembled battery 110 is in the state in which the permissible discharging current Imax_dis1 cannot be calculated and the permissible discharging current Imax_dis2 is determined to be the permissible discharging current Imax_dis of the assembled battery 110. In this way, the optimal permissible current can be determined depending on the state of the assembled battery 110.

(3) The permissible charging current determining unit 705 determines the permissible charging current Imax_chg2 to be the permissible charging current Imax_chg of the assembled battery 110 before the charging of the assembled battery 110 is started, and switches the permissible charging current Imax_chg of the assembled battery 110 from the permissible charging current Imax_chg2 to the permissible charging current Imax_chg1 after the charging of the assembled battery 110 is started. The permissible discharging current determining unit 706 determines the permissible discharging current Imax_dis2 to be the permissible discharging current Imax_dis of the assembled battery 110 before the discharging of the assembled battery 110 is started, and switches the permissible discharging current Imax_dis of the assembled battery 110 from the permissible discharging current Imax_dis2 to the permissible discharging current Imax_dis1 after the discharging of the assembled battery 110 is started. Asa result, it is possible to calculate the permissible current with a smaller error when the charging/discharging of the assembled battery 110 is started.

(4) When the assembled battery 110 is charged, the permissible charging current determining unit 705 and the permissible discharging current determining unit 706 determine the permissible charging current Imax_chg1 to be the permissible charging current Imax_chg of the assembled battery 110 for the charging side, and determines the permissible discharging current Imax_dis2 to be the permissible discharging current Imax_dis of the assembled battery 110 for the discharging side. When the assembled battery 110 discharges, the permissible charging current Imax_chg2 is determined to be the permissible charging current Imax_chg of the assembled battery 110 for the charging side, and the permissible discharging current Imax_dis1 is determined to be the permissible discharging current Imax_dis of the assembled battery 110 for the discharging. With the switching of the charging and discharging of the assembled battery 110, the permissible charging current Imax_chg and the permissible discharging current Imax_dis of the assembled battery 110 are switched between the permissible charging current Imax_chg1 or the permissible discharging current Imax_dis1 and the permissible charging current Imax_chg2 or the permissible discharging current Imax_dis2. As a result, it is possible to select an appropriate permissible current when the charging and discharging of the assembled battery 110 is switched.

Second Embodiment

A second embodiment of the present invention will be described below. In this embodiment, the processing details of the internal resistance detecting unit 701, the permissible charging current determining unit 705, and the permissible discharging current determining unit 706 are modified. The other functions are the same as described in the first embodiment.

Figure 17:
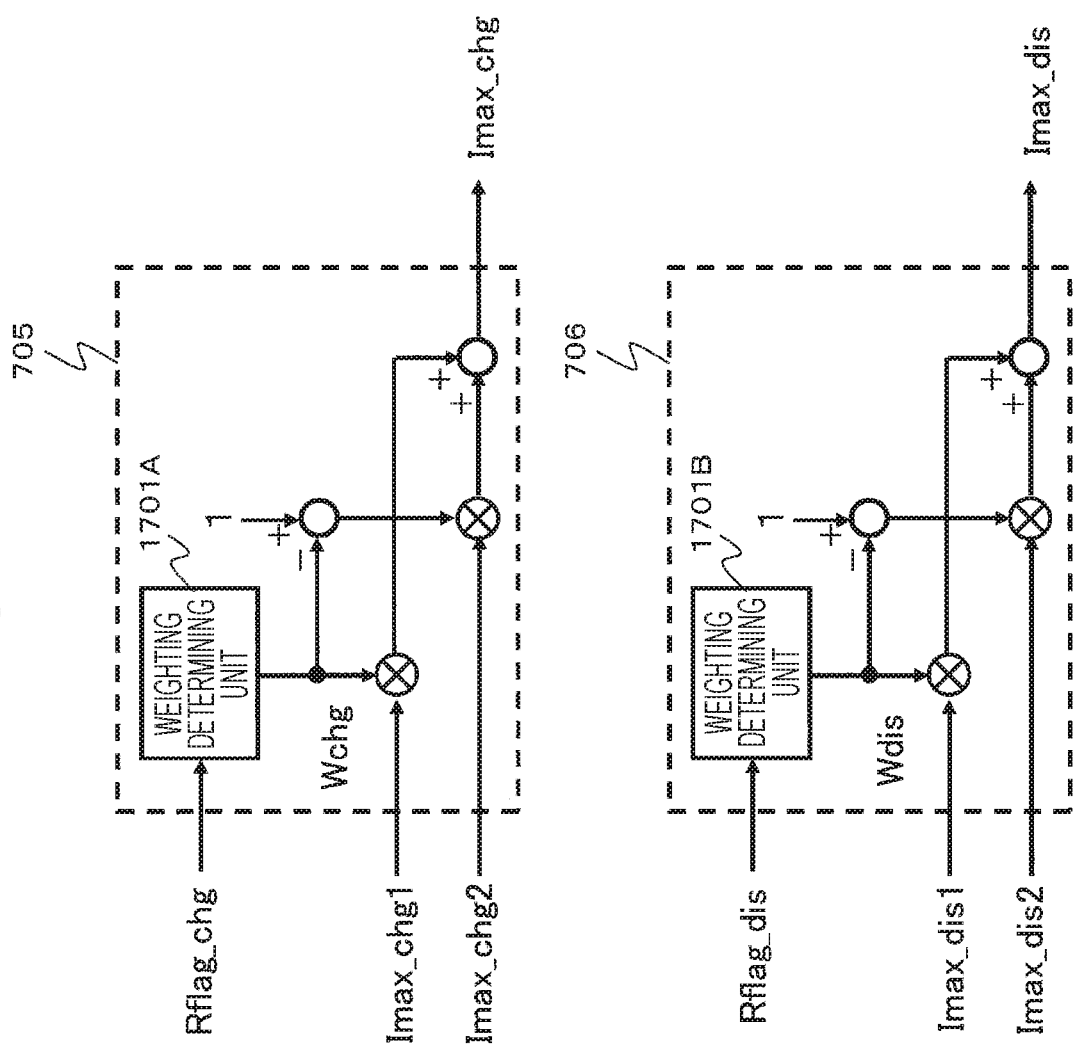
FIG. 17 is a diagram illustrating an example of a block diagram of calculation processes which are performed by a permissible charging current determining unit and a permissible discharging current determining unit according to a second embodiment of the present invention.

FIG. 17 is a diagram illustrating an example of a block diagram of calculation processes which are performed by the permissible charging current determining unit 705 and the permissible discharging current determining unit 706 according to the second embodiment of the present invention. In FIG. 17, the permissible charging current determining unit 705 and the permissible discharging current determining unit 706 are provided with weighting determining units 1701A and 1701B, respectively. The weighting determining units 1701A and 1701B have a function of outputting weighting factors Wchg and Wdis which continuously vary between 0 and 1 when the charging flag Rflag_chg or the discharging flag Rflag_dis varies. Specifically, when the charging flag Rflag_chg varies from "0" to "1," the weighting determining unit 1701A changes the weighting factor Wchg from 0 to 1 with a predetermined slope. On the contrary, when the charging flag Rflag_chg varies from "1" to "0," the weighting determining unit 1701A changes the weighting factor Wchg from 1 to 0 with a predetermined slope. Similarly, when the discharging flag Rflag_dis varies from "0" to "1," the weighting determining unit 1701B changes the weighting factor Wdis from 0 to 1 with a predetermined slope. On the contrary, when the discharging flag Rflag_dis varies from "1" to "0," the weighting determining unit 1701B changes the weighting factor Wdis from 1 to 0 with a predetermined slope.

The permissible charging current determining unit 705 and the permissible discharging current determining unit 706 weight the permissible charging current Imax_chg1 and the permissible discharging current Imax_dis1 from the first permissible current calculating unit 703 and the permissible charging current Imax_chg2 and the permissible discharging current Imax_dis2 from the second permissible current calculating unit 704 by Equations (17) and (18) described below using the weighting factors Wchg and Wdis output as described above, and calculate the final permissible current of the assembled battery 110.

$$Imax\_chg = Wchg \times Imax\_chg1 + (1 - Wchg) \times Imax\_chg2 \quad (17)$$

$$Imax\_dis = Wdis \times Imax\_dis1 + (1 - Wdis) \times Imax\_dis2 \quad (18)$$

Figure 18:
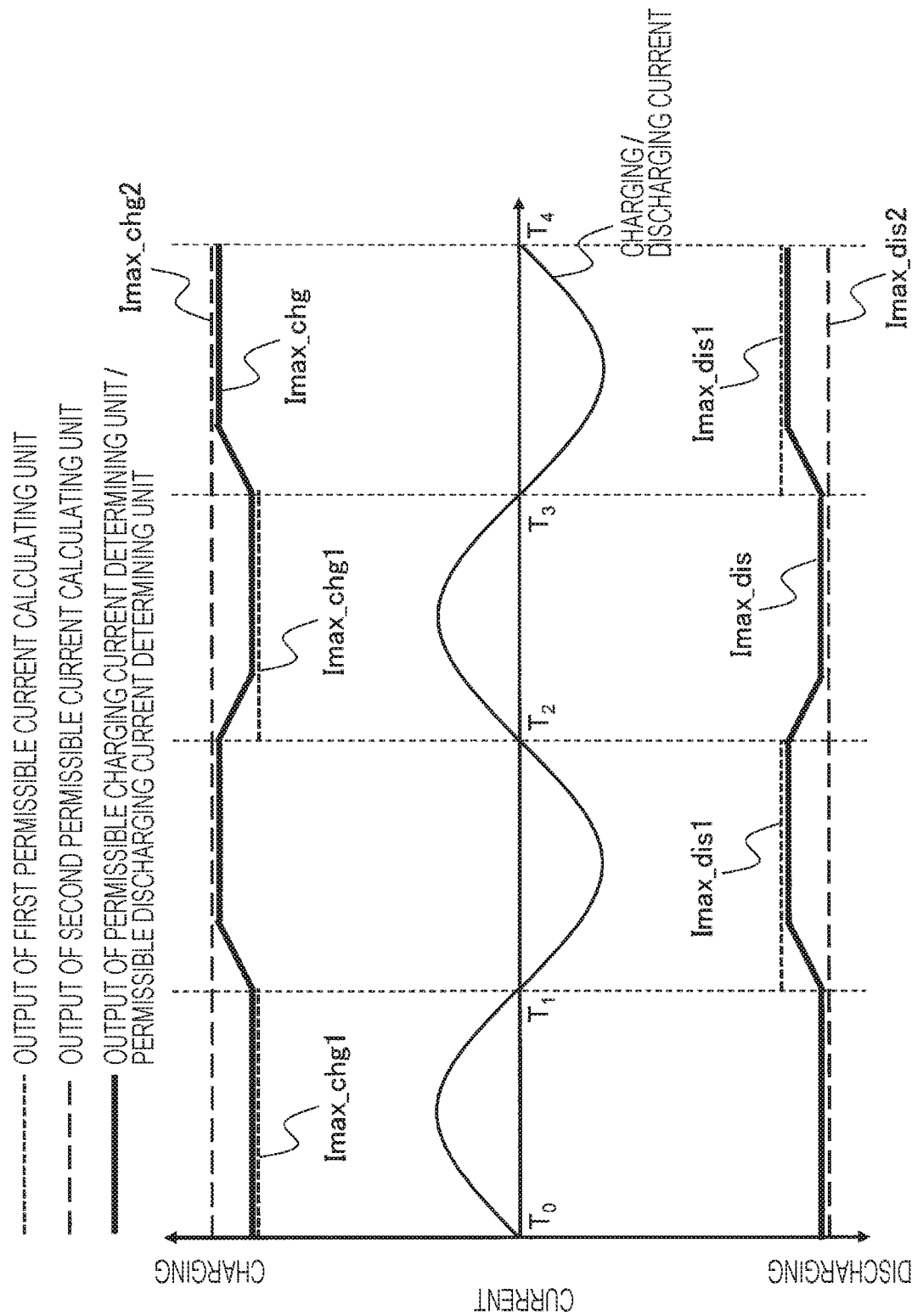
FIG. 18 is a diagram illustrating a state of a permissible current which is finally output from a permissible current calculating unit according to the second embodiment of the present invention.

By adding the weighting determining units 1701A and 1701B, the variation in the permissible current when the charging and the discharging are switched can be made to be slow. FIG. 18 is a diagram illustrating a state of the permissible current which is finally output from the permissible current calculating unit 302 according to the second embodiment of the present invention. Here, similarly to FIG. 13, the charging/discharging current is changed in a sinusoidal shape with a constant period as illustrated in the drawing, the case in which the current value is positive is defined as charging, and the case in which the current value is negative is defined as discharging. It is assumed that the charging flag Rflag_chg is set to "1" immediately when the direction of the current is changed to the charging direction, and the discharging flag Rflag_dis is set to "1" immediately when the direction of the current is changed to the discharging direction.

When the charging/discharging current flows in the charging direction, the permissible charging current determining unit 705 and the permissible discharging current determining unit 706 set the weighting factor Wchg to 1 and set the weighting factor Wdis to 0. Accordingly, the weighting factor of the permissible charging current Imax_chg1 from the first permissible current calculating unit 703 is set to be relatively large for the charging side, and the weighting factor of the permissible discharging current Imax_dis2 from the second permissible current calculating unit 704 is set to be relatively large for the discharging side.

When the charging/discharging current is changed from the charging direction to the discharging direction, the permissible charging current determining unit 705 gradually changes the weighting factor Wchg from 1 to 0. Accordingly, the weighting factor of the permissible charging current Imax_chg1 is gradually decreased and the weighting factor of the permissible charging current Imax_chg2 is gradually increased. As a result, the permissible charging current Imax_chg output from the permissible charging current determining unit 705 is gradually changed from Imax_chg1 to Imax_chg2 as illustrated in the drawing. On the other hand, the permissible discharging current determining unit 706 gradually changes the weighting factor Wdis from 0 to 1. Accordingly, the weighting factor of the permissible discharging current Imax_dis1 is gradually increased and the weighting factor of the permissible discharging current Imax_dis2 is gradually decreased. As a result, the permissible discharging current Imax_dis output from the permissible discharging current determining unit 706 is gradually changed from Imax_dis2 to Imax_dis1 as illustrated in the drawing.

When the charging/discharging current flows in the discharging direction, the permissible charging current determining unit 705 and the permissible discharging current determining unit 706 set the weighting factor Wchg to 0 and set the weighting factor Wdis to 1. Accordingly, the weighting factor of the permissible charging current Imax_chg2 from the second permissible current calculating unit 704 is set to be relatively large for the charging side, and the weighting factor of the permissible discharging current Imax_dis1 from the first permissible current calculating unit 703 is set to be relatively large for the discharging side.

When the charging/discharging current is changed from the discharging direction to the charging direction, the permissible charging current determining unit 705 gradually changes the weighting factor Wchg from 0 to 1. Accordingly, the weighting factor of the permissible charging current Imax_chg1 is gradually increased and the weighting factor of the permissible charging current Imax_chg2 is gradually decreased. As a result, the permissible charging current Imax_chg output from the permissible charging current determining unit 705 is gradually changed from Imax_chg2 to Imax_chg1 as illustrated in the drawing. On the other hand, the permissible discharging current determining unit 706 gradually changes the weighting factor Wdis from 1 to 0. Accordingly, the weighting factor of the permissible discharging current Imax_dis1 is gradually decreased and the weighting factor of the permissible discharging current Imax_dis2 is gradually increased. As a result, the permissible discharging current Imax_dis output from the permissible discharging current determining unit 706 is gradually changed from Imax_dis1 to Imax_dis2 as illustrated in the drawing.

As described above, in the internal resistance detecting unit 701, when the charging/discharging current is less than the threshold value, a predetermined internal resistance value is substituted for Rdet_chg or Rdet_dis, and the first permissible current calculating unit 703 calculates the permissible charging current Imax_chg1 or the permissible discharging current Imax_dis1 using them, there is a possibility that a large error will be included in the calculation result. At this time, the maximum value, the minimum value, the average value, or the like of the internal resistance value which is assumed depending on the characteristics of the assembled battery 110 is considered as the substituted internal resistance value, but the error included in the calculation result of the first permissible current calculating unit 703 increases as a difference from an actual value increases in any case. Accordingly, in this embodiment, it is preferable that the finally calculated internal resistance value be stored in the internal resistance detecting unit 701 and the stored internal resistance value be output when the internal resistance detecting unit 701 cannot calculate the internal resistance value. Accordingly, the permissible charging current Imax_chg and the permissible discharging current Imax_dis output from the permissible charging current determining unit 705 and the permissible discharging current determining unit 706 can be prevented from rapidly varying at the time of switching of the charging and discharging.

According to the above-mentioned second embodiment of the present invention, the following operations and effects can be accomplished.

(1) The permissible charging current determining unit 705 determines the weighting factors Wchg of the permissible charging current Imax_chg1 and the permissible charging current Imax_chg2 and determines the permissible charging current Imax_chg of the assembled battery 110 by weighting and summing the permissible charging current Imax_chg1 and the permissible charging current Imax_chg2 on the basis of the weighting factors Wchg. The permissible discharging current determining unit 706 determines the weighting factors Wdis of the permissible discharging current Imax_dis1 and the permissible discharging current Imax_dis2 and determines the permissible discharging current Imax_dis of the assembled battery 110 by weighting and summing the permissible discharging current Imax_dis1 and the permissible discharging current Imax_dis2 on the basis of the weighting factors Wdis. As a result, it is possible to calculate an appropriate permissible current from two types of permissible currents which are calculated using different methods.

(2) The permissible charging current determining unit 705 and the permissible discharging current determining unit 706 change the weighting factors Wchg and Wdis during charging or discharging of the assembled battery 110. Accordingly, the permissible charging current determining unit 705 sets the weighting factor of the permissible charging current Imax_chg2 to be relatively large before the charging of the assembled battery 110 is started, and sets the weighting factor of the permissible charging current Imax_chg1 to gradually increase and sets the weighting factor of the permissible charging current Imax_chg2 to gradually decrease after the charging of the assembled battery 110 is started. The permissible discharging current determining unit 706 sets the weighting factor of the permissible discharging current Imax_dis2 to be relatively large before the discharging of the assembled battery 110 is started, and sets the weighting factor of the permissible discharging current Imax_dis1 to gradually increase and sets the weighting factor of the permissible discharging current Imax_dis2 to gradually decrease after the discharging of the assembled battery 110 is started. As a result, it is possible to smoothly change the permissible current at the time of switching of the charging and discharging of the assembled battery 110.

Third Embodiment

A third embodiment of the present invention will be described below. In this embodiment, the processing details of the first permissible current calculating unit 703, the second permissible current calculating unit 704, the permissible charging current determining unit 705, and the permissible discharging current determining unit 706 are modified. The other functions are the same as described in the first embodiment.

In this embodiment, the block diagram of the calculation processes which are performed by the permissible charging current determining unit 705 and the permissible discharging current determining unit 706 is the same as illustrated in FIG. 17. That is, the permissible charging current determining unit 705 and the permissible discharging current determining unit 706 are provided with the weighting determining units 1701A and 1701B, respectively.

In the above-mentioned second embodiment, the weighting determining units 1701A and 1701B receive the charging flag Rflag_chg and the discharging flag Rflag_dis, respectively, and output the weighting factors Wchg and Wdis which continuously vary between 0 and 1 on the basis of the flag values. On the other hand, in this embodiment, the first permissible current calculating unit 703 and the second permissible current calculating unit 704 calculate errors of the permissible currents and the weighting determining units 1701A and 1701B determine the weighting factors Wchg and Wdis, respectively, using the errors.

In this embodiment, the first permissible current calculating unit 703 calculates a permissible charging current error ΔImax_chg1 and a permissible discharging current error ΔImax_dis1 in addition to the permissible charging current Imax_chg1 and the permissible discharging current Imax_dis1. Similarly, the second permissible current calculating unit 704 calculates a permissible charging current error ΔImax_chg2 and a permissible discharging current error ΔImax_dis2 in addition to the permissible charging current Imax_chg2 and the permissible discharging current Imax_dis2. The permissible charging current error ΔImax_chg1 calculated by the first permissible current calculating unit 703 and the permissible charging current error ΔImax_chg2 calculated by the second permissible current calculating unit 704 are input to the weighting determining unit 1701A in the permissible charging current determining unit 705. The permissible discharging current error ΔImax_dis1 calculated by the first permissible current calculating unit 703 and the permissible discharging current error ΔImax_dis2 calculated by the second permissible current calculating unit 704 are input to the weighting determining unit 1701B in the permissible discharging current determining unit 706. The permissible charging current error ΔImax_chg1 and the permissible discharging current error ΔImax_dis1 or the permissible charging current error ΔImax_chg2 and the permissible discharging current error ΔImax_dis2 can be calculated by acquiring a measurement error of the current detecting unit 130, the voltage detecting unit 140, or the temperature detecting unit 125 or a difference between the voltage of the equivalent circuit illustrated in FIG. 4 and an actual battery voltage in advance and using them as an input.

The weighting determining units 1701A and 1701B determine the weighting factors Wchg and Wdis by Equations (19) and (20) described below using the input permissible current errors.

$$Wchg = \Delta Imax\_chg2^2 / (\Delta Imax\_chg1^2 + \Delta Imax\_chg2^2) \quad (19)$$

$$Wdis = \Delta Imax\_dis2^2 / (\Delta Imax\_dis1^2 + \Delta Imax\_dis2^2) \quad (20)$$

By using the weighting factors Wchg and Wdis, the permissible charging current determining unit 705 and the permissible discharging current determining unit 706 can calculate the final permissible currents of the assembled battery 110 by Equations (17) and (18). By causing the weighting determining units 1701A and 1701B to determine the weighting factors Wchg and Wdis depending on only the error included in the calculation result of the first permissible current calculating unit 703, the process may be simplified. That is, the permissible charging current determining unit 705 and the permissible discharging current determining unit 706 determine the weighting factors Wchg and Wdis on the basis of the permissible charging current error $\Delta$Imax_chg1 and the permissible discharging current error $\Delta$Imax_dis1 calculated by the first permissible current calculating unit 703, respectively.

As described above, in the internal resistance detecting unit 701, when the charging/discharging current is less than the threshold value, a predetermined internal resistance value is substituted for Rdet_chg or Rdet_dis, and the first permissible current calculating unit 703 calculates the permissible charging current Imax_chg1 or the permissible discharging current Imax_dis1 using them, there is a possibility that a large error will be included in the calculation result. Accordingly, in this case, it is preferable that the value of the permissible charging current error $\Delta$Imax_chg1 or the permissible discharging current error $\Delta$Imax_dis1 output from the first permissible current calculating unit 703 be set to a maximum value in an assumed range. Accordingly, it is possible to calculate an appropriate permissible current by minimizing the weighting factor of the permissible charging current Imax_chg1 or the permissible discharging current Imax_dis1 including a large error and maximizing the weighting factor of the permissible charging current Imax_chg2 or the permissible discharging current Imax_dis2.

According to the above-mentioned third embodiment of the present invention, the first permissible current calculating unit 703 calculates the permissible charging current error $\Delta$Imax_chg1 indicating the error of the permissible charging current Imax_chg1 and the permissible discharging current error $\Delta$Imax_dis1 indicating the error of the permissible discharging current Imax_dis1. The second permissible current calculating unit 704 calculates the permissible charging current error $\Delta$Imax_chg2 indicating the error of the permissible charging current Imax_chg2 and the permissible discharging current error $\Delta$Imax_dis2 indicating the error of the permissible discharging current Imax_dis2. The permissible charging current determining unit 705 and the permissible discharging current determining unit 706 determine the weighting factors Wchg and Wdis on the basis of at least one of the errors. As a result, it is possible to calculate an appropriate permissible current depending on the magnitudes of the errors included in two types of permissible currents which are acquired using different methods.

Fourth Embodiment

A fourth embodiment of the present invention will be described below. In this embodiment, the permissible current is corrected in consideration of a variation in an internal resistance of the assembled battery 110.

When charging and discharging of the assembled battery 110 are repeated and thus deterioration thereof progresses, characteristic variations such as an increase in the internal resistance thereof and a decrease in the full-charged capacity thereof are caused. The battery state predicting unit 702 predicts the state of the assembled battery 110 depending on the battery characteristics acquired in advance by a charging and discharging test. Accordingly, when the above-mentioned variations in the battery characteristics are caused, an error is included in the prediction result of the battery state. As a result, this error is included in the permissible charging current Imax_chg2 or the permissible discharging current Imax_dis2 which is calculated by the second permissible current calculating unit 704 using the prediction result of the battery state predicting unit 702.

Figure 19:
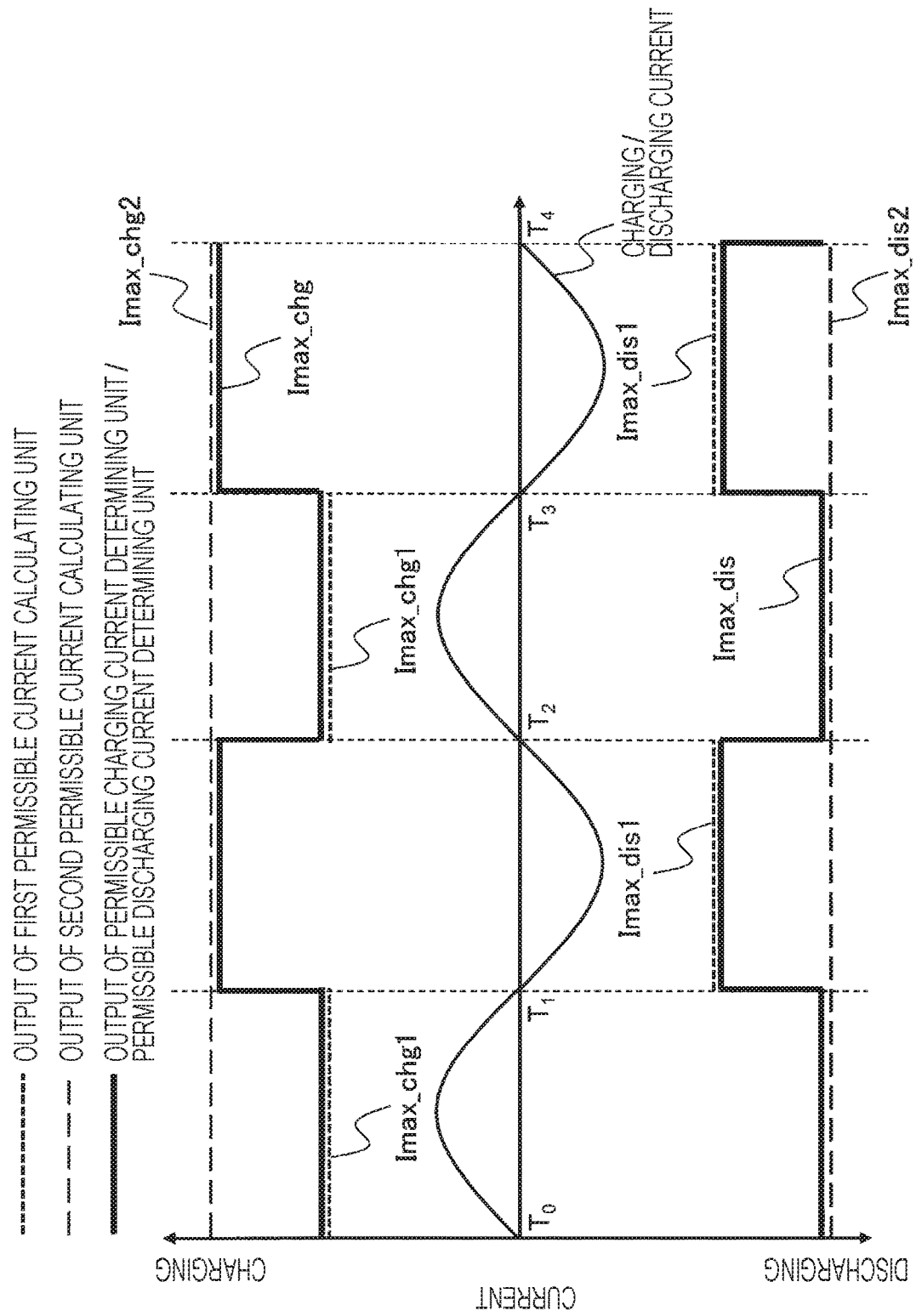
FIG. 19 is a diagram illustrating a state of a permissible current which is finally output from a permissible current calculating unit when correction is not performed and calculation precision of a second permissible current calculating unit decreases according to a fourth embodiment of the present invention.

FIG. 19 is a diagram illustrating a state of a permissible current which is finally output from the permissible current calculating unit 302 when correction is not performed and calculation precision of the second permissible current calculating unit 704 decreases according to the fourth embodiment of the present invention. When the calculation precision of the second permissible current calculating unit 704 decreases and thus the error of the prediction result of the battery state increases, as illustrated in FIG. 19, a difference between the permissible charging current Imax_chg1 or the permissible discharging current Imax_dis1 output from the first permissible current calculating unit 703 and the permissible charging current Imax_chg2 or the permissible discharging current Imax_dis2 output from the second permissible current calculating unit 704 increases. Accordingly, when the charging and discharging of the assembled battery 110 is switched, the permissible current output from the permissible current calculating unit 302 varies greatly.

Therefore, in this embodiment, a function of correcting the calculation result of the second permissible current calculating unit 704 is added to the permissible current calculating unit 302. Specific details thereof will be described below in detail.

Figure 20:
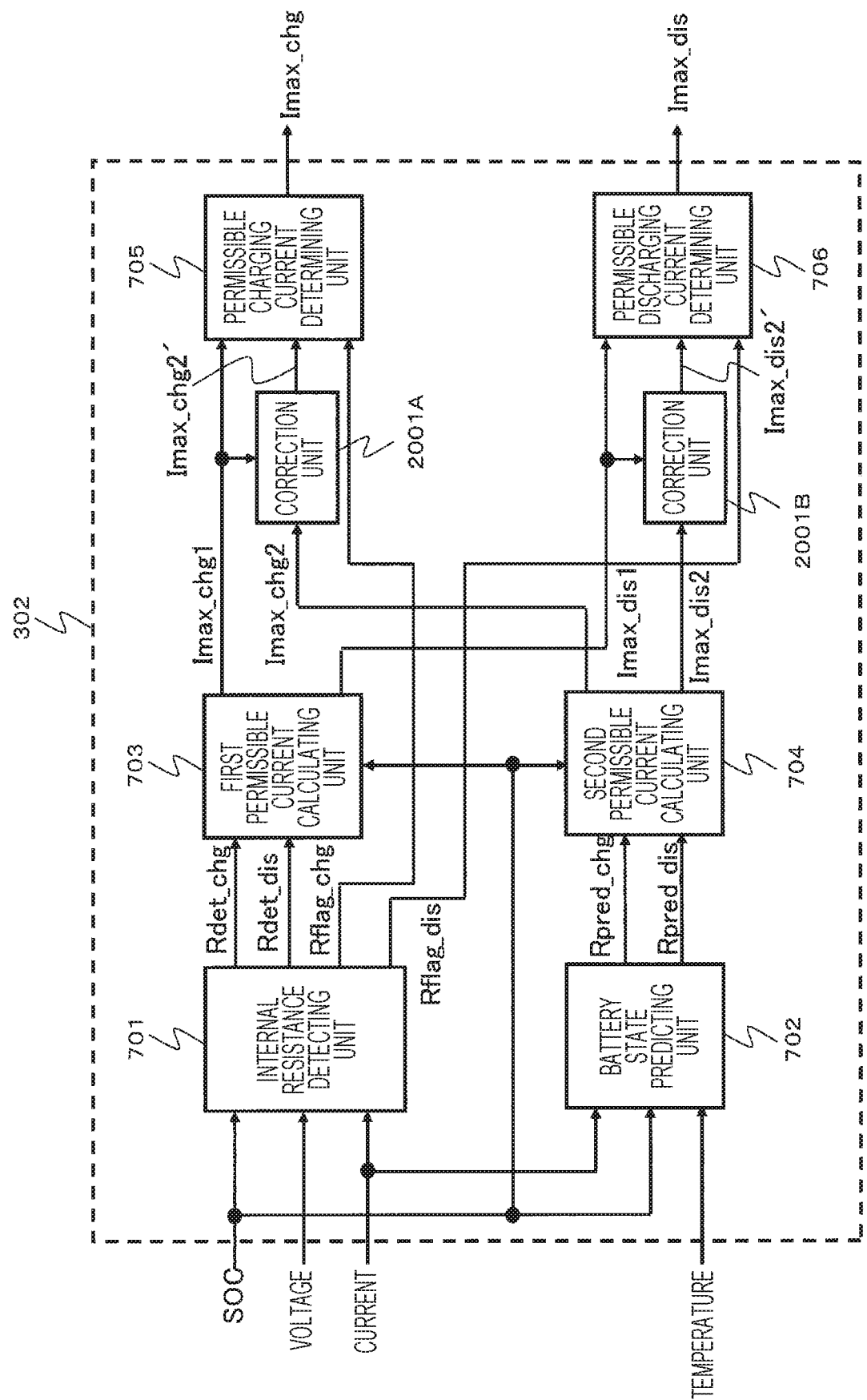
FIG. 20 is a diagram illustrating an example of a block diagram of a permissible current calculating unit according to the fourth embodiment of the present invention.

FIG. 20 is a diagram illustrating an example of a block diagram of the permissible current calculating unit 302 according to the fourth embodiment of the present invention. In comparison with the block diagram illustrated in FIG. 7 according to the first embodiment, correction units 2001A and 2001B are added in FIG. 20. The correction unit 2001A compares the permissible charging current Imax_chg1 from the first permissible current calculating unit 703 with the permissible charging current Imax_chg2 from the second permissible current calculating unit 704, and corrects the permissible charging current Imax_chg2 on the basis of the comparison result. The correction unit 2001B compares the permissible discharging current Imax_dis1 from the first permissible current calculating unit 703 with the permissible discharging current Imax_dis2 from the second permissible current calculating unit 704, and corrects the permissible discharging current Imax_dis2 on the basis of the comparison result.

Specifically, the correction unit 2001A calculates a difference between the permissible charging current Imax_chg1 and the permissible charging current Imax_chg2 and corrects the permissible charging current Imax_chg2 using a correction coefficient which is determined on the basis of the difference. Alternatively, the correction unit 2001A calculates a ratio of the permissible charging current Imax_chg1 and the permissible charging current Imax_chg2 and corrects the permissible charging current Imax_chg2 using a correction coefficient which is determined on the basis of the ratio. The correction result is output as a corrected permissible charging current Imax_chg2'. Similarly, the correction unit 2001B calculates a difference between the permissible discharging current Imax_dis1 and the permissible discharging current Imax_dis2 and corrects the permissible discharging current Imax_dis2 using a correction coefficient which is determined on the basis of the difference. Alternatively, the correction unit 2001B calculates a ratio of the permissible discharging current Imax_dis1 and the permissible discharging current Imax_dis2 and corrects the permissible discharging current Imax_dis2 using a correction coefficient which is determined on the basis of the ratio. The correction result is output as a corrected permissible discharging current Imax_dis2'. By determining the correction coefficient from an average value of the differences or the ratios, the correction coefficient may be used in common on the charging side and the discharging side. The correction may not be performed when the difference or ratio is in a predetermined range, and the correction may be performed when the difference or ratio is out of the predetermined range. The correction coefficient may be determined depending on the charging/discharging time of the assembled battery 110 or the polarization voltage VPpred or the like which can be output from the battery state predicting unit 702. In any case, when plural correction coefficients based on the difference or ratio between the permissible charging current Imax_chg1 and the permissible charging current Imax_chg2 or the difference or ratio between the permissible discharging current Imax_dis1 and the permissible discharging current Imax_dis2 is stored in advance in the correction units 2001A and 2001B, the permissible charging current Imax_chg2 and the permissible discharging current Imax_dis2 can be corrected using the correction coefficient selected therefrom.

Figure 21:
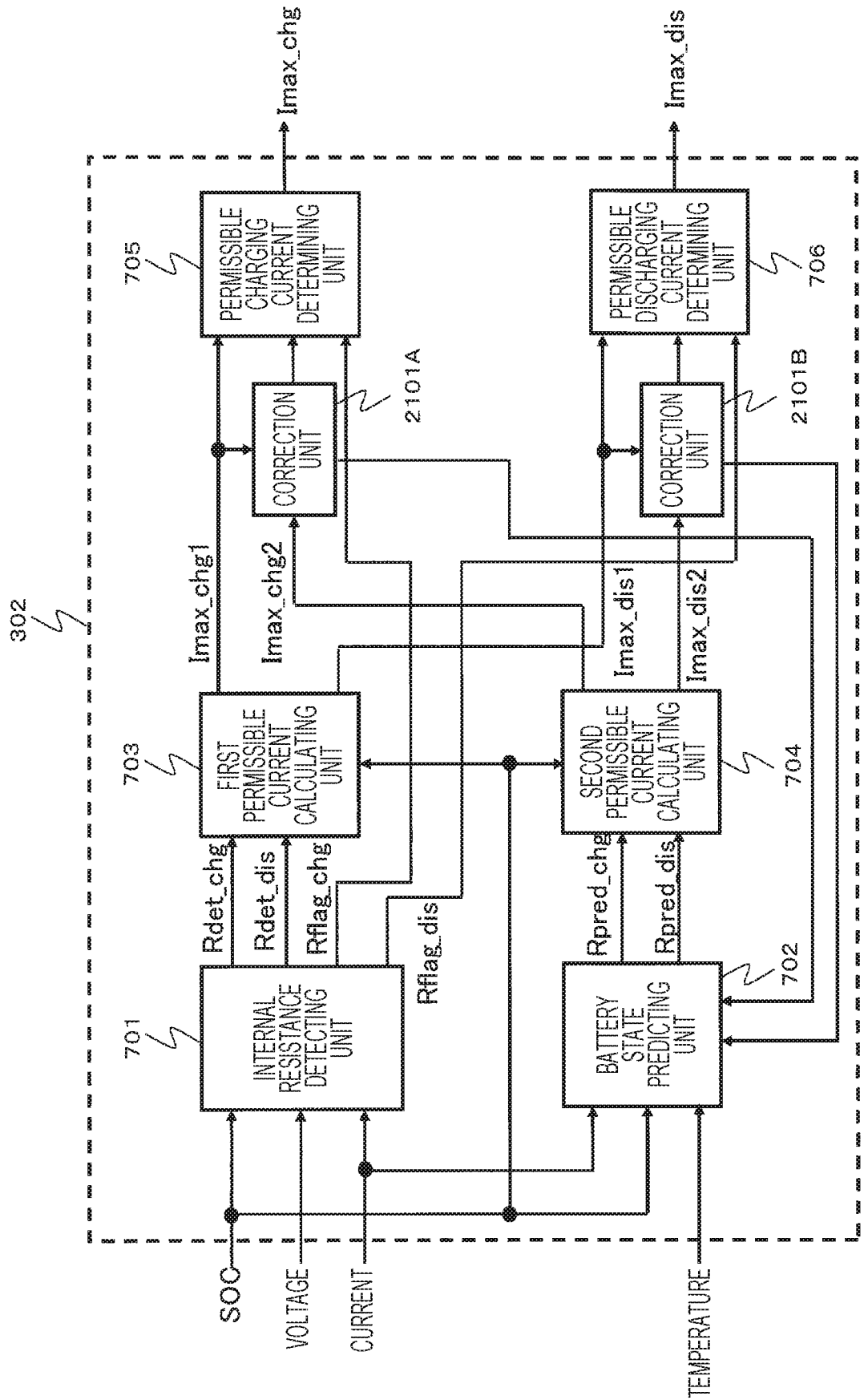
FIG. 21 is a diagram illustrating another example of the block diagram of the permissible current calculating unit according to the fourth embodiment of the present invention.

FIG. 21 is a diagram illustrating another example of the block diagram of the permissible current calculating unit 302 according to the fourth embodiment of the present invention. In comparison with the block diagram illustrated in FIG. 7 according to the first embodiment, correction units 2101A and 2101B are added in FIG. 21. The correction unit 2101A compares the permissible charging current Imax_chg1 from the first permissible current calculating unit 703 with the permissible charging current Imax_chg2 from the second permissible current calculating unit 704, and corrects information, which is used for the second permissible current calculating unit 704 to calculate the permissible charging current Imax_chg2 among the battery characteristic information output as the prediction result of the battery state from the battery state predicting unit 702 on the basis of the comparison result. The correction unit 2101B compares the permissible discharging current Imax_dis1 from the first permissible current calculating unit 703 with the permissible discharging current Imax_dis2 from the second permissible current calculating unit 704, and corrects information, which is used for the second permissible current calculating unit 704 to calculate the permissible discharging current Imax_dis2 among the battery characteristic information output as the prediction result of the battery state from the battery state predicting unit 702 on the basis of the comparison result.

Specifically, the correction unit 2101A calculates the difference or ratio between the permissible charging current Imax_chg1 and the permissible charging current Imax_chg2 and corrects the predicted internal resistance value in charging Rpred_chg output from the battery state predicting unit 702 so as to reduce the difference or ratio. Similarly, the correction unit 2101B calculates the difference or ratio between the permissible discharging current Imax_dis1 and the permissible discharging current Imax_dis2 and corrects the predicted internal resistance value in discharging Rpred_dis output from the battery state predicting unit 702 so as to reduce the difference or ratio. Correction common to the charging side and the discharging side may be performed by calculating an average value of the differences or ratios. The correction may not be performed when the difference or ratio is in a predetermined range, and the correction may be performed when the difference or ratio is out of the predetermined range. The correction coefficient may be determined depending on the charging/discharging time of the assembled battery 110 or the polarization voltage VPpred or the like which can be output from the battery state predicting unit 702. The polarization resistor 403 or the capacitive element 404 for acquiring the polarization voltage VPpred or the time constant determined by the polarization resistor 403 and the capacitive element 404 may be corrected. In any case, when plural correction coefficients based on the difference or ratio between the permissible charging current Imax_chg1 and the permissible charging current Imax_chg2 or the difference or ratio between the permissible discharging current Imax_dis1 and the permissible discharging current Imax_dis2 is stored in advance in the correction units 2101A and 2101B, the predicted internal resistance values Rpred_chg and Rpred_dis or the like can be corrected using the correction coefficient selected depending on the difference or ratio.

In this embodiment, even when any one of the above-mentioned two examples is used, it is possible to compare the outputs of the first permissible current calculating unit 703 and the second permissible current calculating unit 704 and to improve the permissible current error included in the output of the second permissible current calculating unit 704 on the basis of the comparison result.

Figure 22:
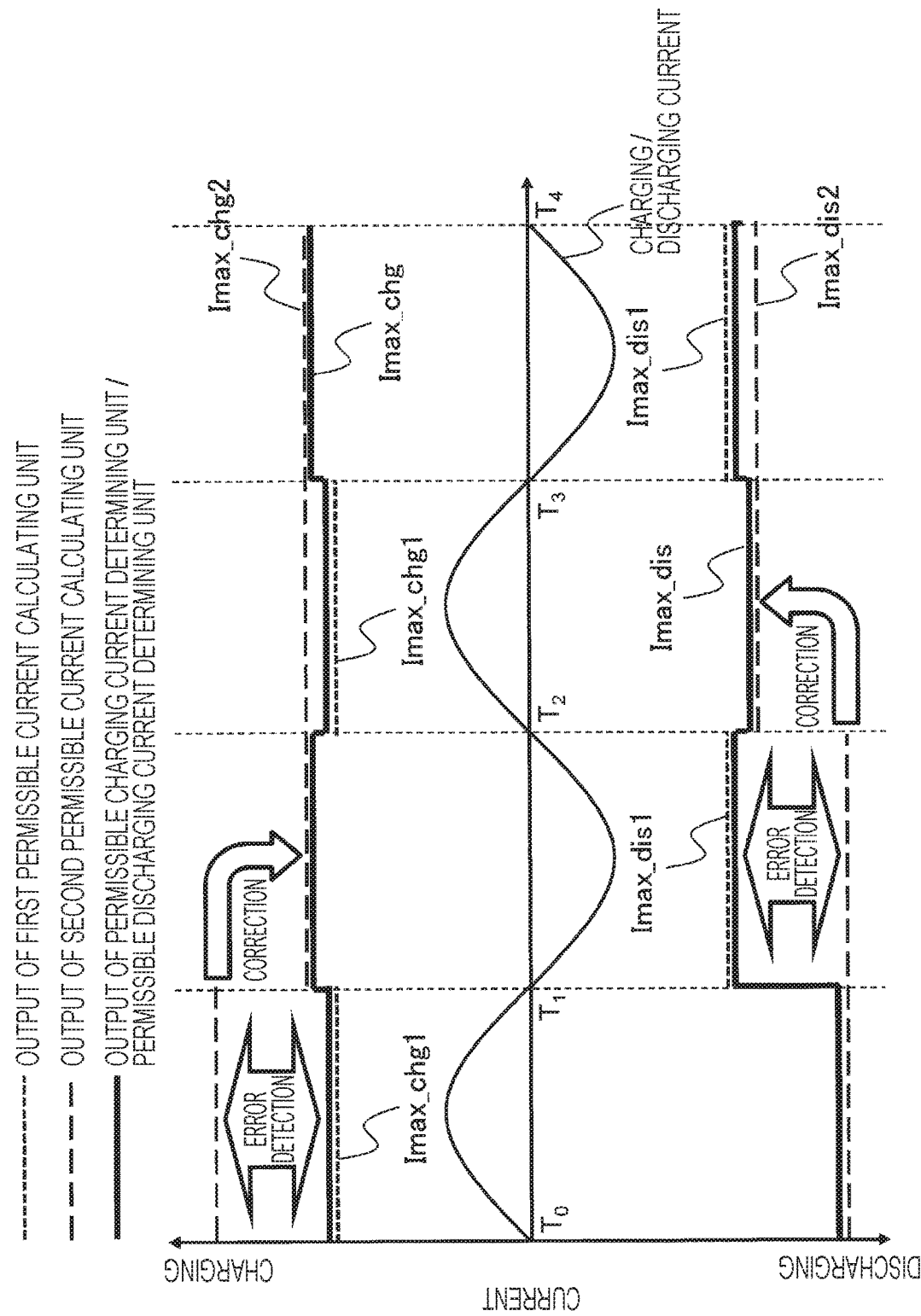
FIG. 22 is a diagram illustrating a state of a permissible current which is finally output from the permissible current calculating unit according to the fourth embodiment of the present invention.

FIG. 22 is a diagram illustrating a state of the permissible current which is finally output from the permissible current calculating unit 302 according to the fourth embodiment of the present invention. In FIG. 22, in a period of time from time T0 to time T1, a large difference is caused between the permissible charging current Imax_chg1 output from the first permissible current calculating unit 703 and the permissible charging current Imax_chg2 output from the second permissible current calculating unit 704. At this time, after time T1, it can be seen that the permissible charging current Imax_chg2 output from the second permissible current calculating unit 704 is corrected by the above-mentioned correction process. In a period of time from time T1 to time T2, a large difference is caused between the permissible discharging current Imax_dis1 output from the first permissible current calculating unit 703 and the permissible discharging current Imax_dis2 output from the second permissible current calculating unit 704. At this time, after time T2, it can be seen that the permissible discharging current Imax_dis2 output from the second permissible current calculating unit 704 is corrected by the above-mentioned correction process.

According to the above-mentioned fourth embodiment of the present invention, the following operations and effects can be accomplished.

(1) In the assembled battery control unit 150, the permissible current calculating unit 302 includes the first permissible current calculating unit 703, the second permissible current calculating unit 704, the permissible charging current determining unit 705, the permissible discharging current determining unit 706, and the correction units 2001A and 2001B or the correction units 2101A and 2101B. The first permissible current calculating unit 703 calculates the permissible charging current Imax_chg1 and the permissible discharging current Imax_dis1 as the permissible current of the assembled battery 110 based on the voltage of the assembled battery 110 detected by the voltage detecting unit 140. The second permissible current calculating unit 704 calculates the permissible charging current Imax_chg2 and the permissible discharging current Imax_dis2 as the permissible current of the assembled battery 110 without using the voltage of the assembled battery 110. The correction units 2001A and 2101A compares the permissible charging current Imax_chg1 with the permissible charging current Imax_chg2 and performs a predetermined correction process on the basis of the comparison result. The correction units 2001B and 2101B compares the permissible discharging current Imax_dis1 with the permissible discharging current Imax_dis2 and performs a predetermined correction process on the basis of the comparison result. As a result, it is possible to detect the permissible current of the assembled battery 110 with high precision in consideration of the influence of the increase in the internal resistance based on the state of health of the assembled battery 110.

(2) The correction units 2001A and 2001B perform a correction process by correcting the calculation results of the permissible charging current Imax_chg2 and the permissible discharging current Imax_dis2 by the second permissible current calculating unit 704. The correction units 2101A and 2101B perform a correction process of correcting the predicted internal resistance values Rpred_chg and Rpred_dis which are characteristics information of the assembled battery 110 used for the second permissible current calculating unit 704 to calculate the permissible charging current Imax_chg2 or the permissible discharging current Imax_dis2. As a result, it is possible to perform an appropriate correction process on the acquired permissible current with the increase in the internal resistance of the assembled battery 110.

(3) The correction units 2001A, 2001B, 2101A, and 2101B store plural correction coefficients corresponding to the difference or ratio between the permissible charging current Imax_chg1 and the permissible charging current Imax_chg2 or the difference or ratio between the permissible discharging current Imax_dis1 and the permissible discharging current Imax_dis2 in advance, and perform the correction process using the correction coefficient selected among the plural correction coefficients. As a result, it is possible to perform an appropriate correction process depending on a variation of the permissible charging current Imax_chg2 or the permissible discharging current Imax_dis2 which is caused with the increase in the internal resistance of the assembled battery 110.

(4) The correction units 2001A, 2001B, 2101A, and 2101B can determine the correction coefficient which is used for each correction process depending on the charging/discharging time or the polarization voltage VPpred or the like of the assembled battery 110. As a result, it is possible to perform a more appropriate correction process in consideration of the state of health of the assembled battery 110.

(5) The correction units 2001A and 2101A compare the permissible charging current Imax_chg1 with the permissible charging current Imax_chg2 and perform the correction process on the basis of the comparison result, when the assembled battery 110 is charged. The correction units 2001B and 2101B compare the permissible discharging current Imax_dis1 with the permissible discharging current Imax_dis2 and perform the correction process on the basis of the comparison result, when the assembled battery 110 discharges. As a result, it is possible to appropriately switch the permissible current to be corrected depending on the charging/discharging state of the assembled battery 110.

Fifth Embodiment

A fifth embodiment of the present invention will be described below. In this embodiment, a calculation result of a permissible current is monitored to estimate a state of health (SOH) of an assembled battery 110 and expiration of a lifespan of the assembled battery 110 is determined on the basis of the estimation result.

Figure 23:
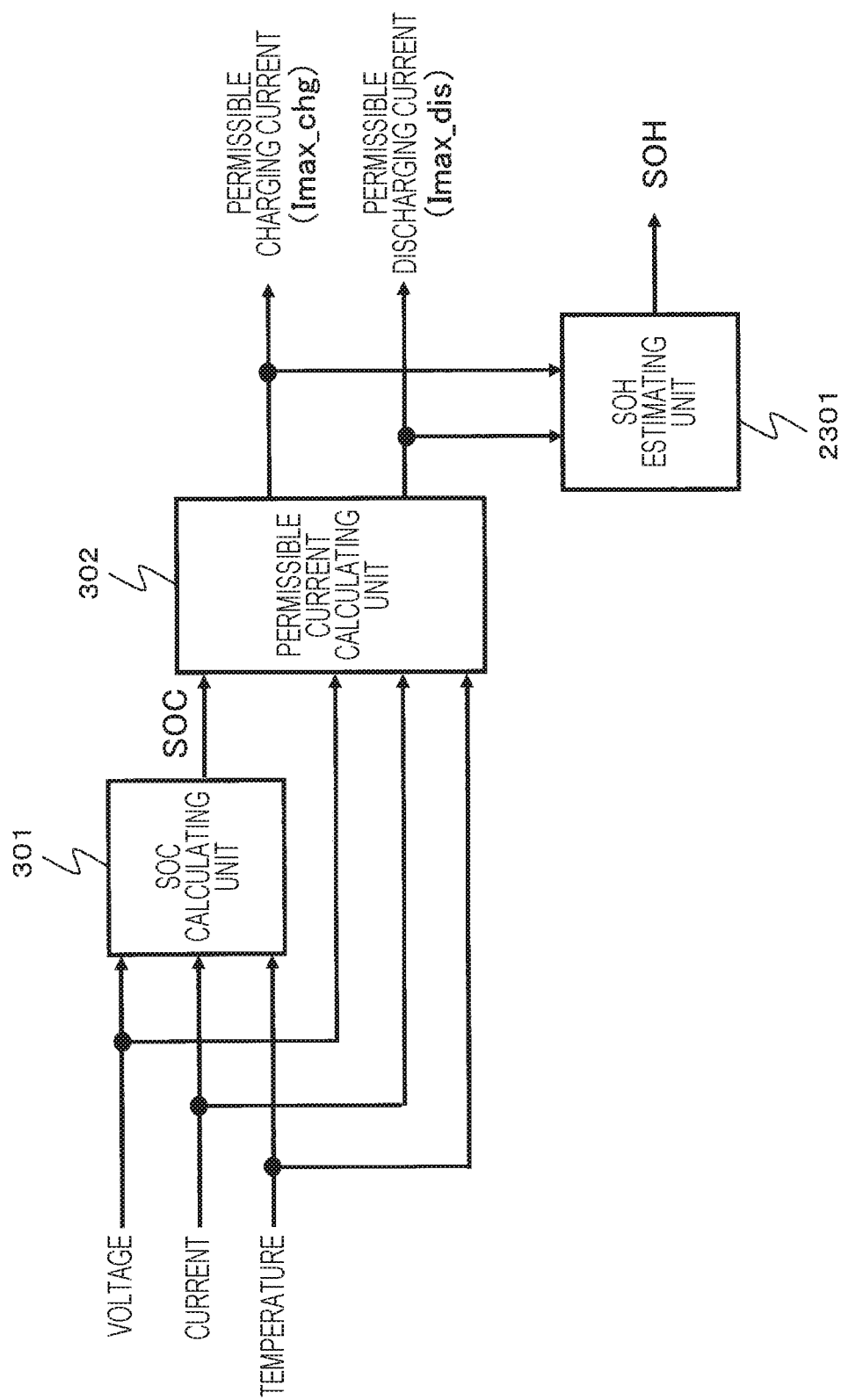
FIG. 23 is a block diagram illustrating processing details which are performed by an assembled battery control unit according to a fifth embodiment of the present invention.

FIG. 23 is a block diagram illustrating processing details which are performed by the assembled battery control unit 150 according to the fifth embodiment of the present invention. As illustrated in FIG. 23, the assembled battery control unit 150 further includes an SOH estimating unit 2301 that monitors the output of the permissible current calculating unit 302 to estimate a state of health (SOH) of the assembled battery 110 in comparison with the block diagram illustrated in FIG. 3 according to the first embodiment.

As described above, when charging and discharging of the assembled battery 110 are repeated and thus deterioration progresses, a characteristic variation such as a decrease in a full-charged capacity due to an increase in the internal resistance. When the internal resistance of the assembled battery 110 increases, the permissible current decreases. The SOH estimating unit 2301 estimates deterioration of the assembled battery 110 by monitoring a degree of decrease in the permissible current. Specifically, when the calculation result of the degree of decrease in the permissible current using Equation (21) described below is defined as SOH, the SOH of the assembled battery 110 is calculated. In Equation (21), Imax_new denotes the permissible current of the assembled battery 110 as a new product, and Imax_det denotes the permissible current of the assembled battery 110 at the present time (at the time of deterioration).

$$SOH = I\text{max\_det}/I\text{max\_new} \tag{21}$$

As described in the above-mentioned embodiments, in the permissible current calculating unit 302, the permissible charging current determining unit 705 determines the permissible charging current Imax_chg on the basis of the permissible charging current Imax_chg1 calculated by the first permissible current calculating unit 703 and the permissible charging current Imax_chg2 calculated by the second permissible current calculating unit 704 as illustrated in FIGS. 7, 14, 20, and 21. The permissible discharging current determining unit 706 determines the permissible discharging current Imax_dis on the basis of the permissible discharging current Imax_dis1 calculated by the first permissible current calculating unit 703 and the permissible discharging current Imax_dis2 calculated by the second permissible current calculating unit 704. With a focus placed on one or both of the permissible charging current Imax_chg and the permissible discharging current Imax_dis, the SOH estimating unit 2301 stores the output of the permissible current calculating unit 302 at a time point at which use of the assembled battery 110 is started as the permissible current Imax_new and can estimate the present SOH of the assembled battery 110 by Equation (21) using the present output of the permissible current calculating unit 302 as the permissible current Imax_det. In this case, the permissible charging current Imax_chg and the permissible discharging current Imax_dis may be averaged to calculate the permissible current Imax_det or Imax_new.

Alternatively, the SOH estimating unit 2301 may estimate the present SOH of the assembled battery 110 directly using the output of the first permissible current calculating unit 703 or the output of the second permissible current calculating unit 704. That is, when a focus is placed on the output of the first permissible current calculating unit 703, the present SOH of the assembled battery 110 can be estimated by Equation (21) using one or both of the permissible charging current Imax_chg1 and the permissible discharging current Imax_dis1 at the time point at which use of the assembled battery 110 is started as the permissible current Imax_new and using one or both of the permissible charging current Imax_chg1 and the permissible discharging current Imax_dis1 at the present time as the permissible current Imax_det. When a focus is placed on the output of the second permissible current calculating unit 704, the present SOH of the assembled battery 110 can be estimated by Equation (21) using one or both of the permissible charging current Imax_chg2 and the permissible discharging current Imax_dis2 at the time point at which use of the assembled battery 110 is started as the permissible current Imax_new and using one or both of the permissible charging current Imax_chg2 and the permissible discharging current Imax_dis2 at the present time as the permissible current Imax_det.

As described above, the SOH of the assembled battery 110 estimated by the SOH estimating unit 2301 is received by the vehicle control unit 200. The vehicle control unit 200 determines that the lifespan of the assembled battery 110 expires when the SOH value is less than a predetermined threshold value. The expiration of the lifespan of the assembled battery 110 may be determined by the SOH estimating unit 2301. Instead of determination using the parameter SOH, the expiration of the lifespan may be determined when the permissible current value acquired by calculation is less than a threshold value.

According to the above-mentioned fifth embodiment, the SOH estimating unit 2301 monitors at least one of the calculation result of the permissible current by the first permissible current calculating unit 703 and the calculation result of the permissible current by the second permissible current calculating unit 704 and estimates the SOH of the assembled battery 110. As a result, it is possible to accurately determine a deteriorating status of the assembled battery 110 in the battery system 100.

The SOH estimating unit 2301 may estimate whether the lifespan of the assembled battery 110 expires on the basis of the estimation result of the SOH of the assembled battery 110. As a result, it is possible to accurately determine the expiration of the lifespan of the assembled battery 110 in the battery system 100.

Sixth Embodiment

A sixth embodiment of the present invention will be described below. In this embodiment, a calculation result of a permissible current is monitored to estimate a state of health (SOH) of an assembled battery 110 and expiration of a lifespan of the assembled battery 110 is determined on the basis of the estimation result.

Figure 24:
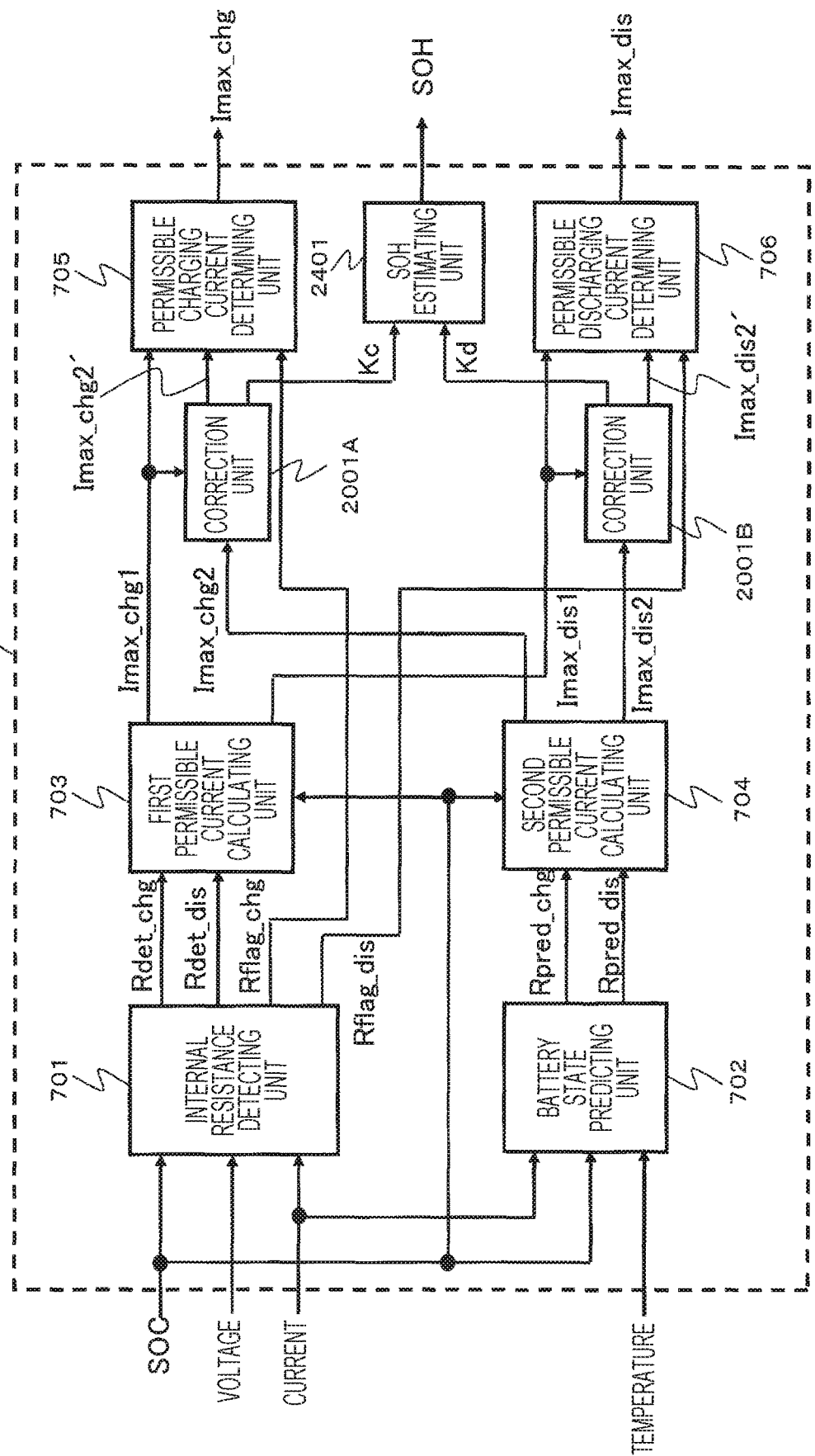
FIG. 24 is a block diagram illustrating a permissible current calculating unit according to a sixth embodiment of the present invention.

FIG. 24 is a block diagram illustrating the permissible current calculating unit 302 according to the sixth embodiment of the present invention. In comparison with the block diagram illustrated in FIG. 20 according to the fourth embodiment, an SOH estimating unit 2401 is added in FIG. 24. The SOH estimating unit 2401 estimates the SOH of the assembled battery 110 by monitoring a coefficient Kc indicating a correction value or a correction rate of the permissible current by the correction unit 2001A and a coefficient Kd indicating a correction value or a correction rate of the permissible current by the correction unit 2001B. When the assembled battery 110 is deteriorated, the permissible current decreases and thus the correction units 2001A and 2001B correct the calculation result of the permissible current to match the decrease of the permissible current. The coefficients Kc and Kd indicating a correction value or a correction rate of the permissible current instead of the SOH can be used as a parameter indicating a degree of deterioration of the assembled battery 110.

According to the above-mentioned sixth embodiment, the SOH estimating unit 2401 monitors the results of the correction processes by the correction units 2001A and 2001B and estimates the SOH of the assembled battery 110. As a result, it is possible to accurately determine the deteriorating status of the assembled battery 110 in the battery system 100.

The SOH estimating unit 2401 may determine whether the lifespan of the assembled battery 110 expires on the basis of the estimation result of the SOH of the assembled battery 110. As a result, it is possible to accurately determine the expiration of the lifespan of the assembled battery 110 in the battery system 100.

Seventh Embodiment

A seventh embodiment of the present invention will be described below. In this embodiment, a correction result of characteristic information of an assembled battery 110 is monitored to estimate an SOH of the assembled battery 110 and expiration of a lifespan of the assembled battery 110 is determined on the basis of the estimation result.

Figure 25:
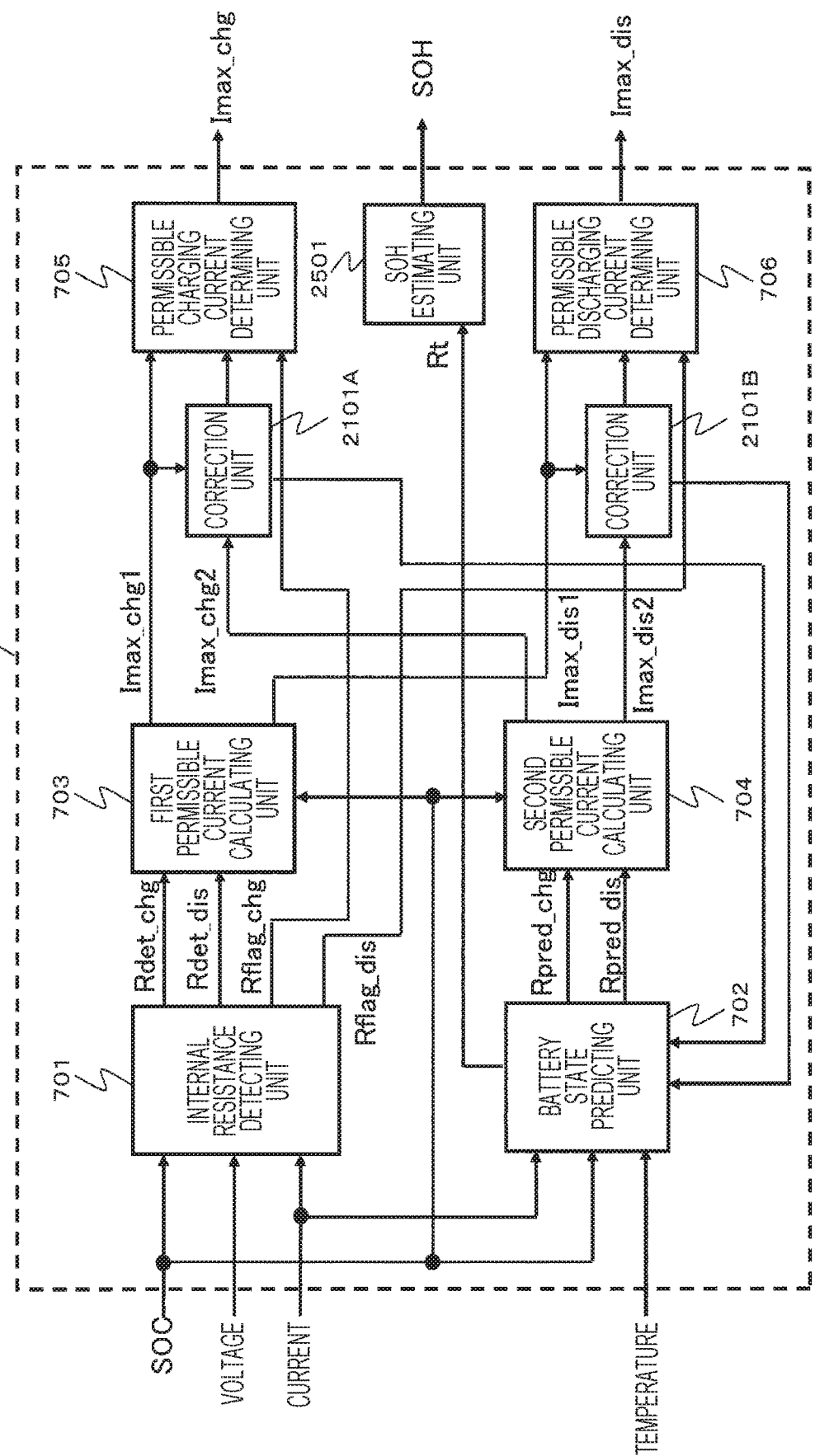
FIG. 25 is a block diagram illustrating a permissible current calculating unit according to a seventh embodiment of the present invention.

FIG. 25 is a block diagram illustrating the permissible current calculating unit 302 according to the seventh embodiment of the present invention. In comparison with the block diagram illustrated in FIG. 21 according to the fourth embodiment, an SOH estimating unit 2501 is added in FIG. 25. The SOH estimating unit 2501 estimates the SOH of the assembled battery 110 by monitoring a correction result Rt of the output of the battery state predicting unit 702 by the correction units 2101A and 2101B. For example, the predicted internal resistance values Rpred_chg and Rpred_dis which have been corrected by the correction units 2101A and 2101B can be acquired as the correction result Rt and the present SOH of the assembled battery 110 can be estimated by Equation (22) described below using the correction result. In Equation (22), R_new denotes the internal resistance of the assembled battery 110 as a new product and R_det denotes the internal resistance of the assembled battery 110 at the present time (at the time of deterioration).

$$SOH = R\_det / R\_new \qquad (22)$$

As described in the fourth embodiment above, the correction unit 2101A corrects the predicted internal resistance value in charging Rpred_chg output from the battery state predicting unit 702 on the basis of the permissible charging current Imax_chg1 calculated by the first permissible current calculating unit 703 and the permissible charging current Imax_chg2 calculated by the second permissible current calculating unit 704. The correction unit 2101B corrects the predicted internal resistance value in discharging Rpred_dis output from the battery state predicting unit 702 on the basis of the permissible discharging current Imax_dis1 calculated by the first permissible current calculating unit 703 and the permissible discharging current Imax_dis2 calculated by the second permissible current calculating unit 704. With a focus planed on one or both of the correction results of the predicted internal resistance values Rpred_chg and Rpred_dis, the SOH estimating unit 2501 can store the output of the battery state predicting unit 702 at a time point at which use of the assembled battery 110 is started as R_new and can estimate the present SOH of the assembled battery 110 by Equation (22) using the output of the battery state predicting unit 702 at the present time as R_det. In this case, the predicted internal resistance value in charging Rpred_chg and the predicted internal resistance value in discharging Rpred_dis may be averaged to calculate R_det or R_new.

According to the above-mentioned seventh embodiment, the SOH estimating unit 2501 monitors the results of the correction processes by the correction units 2101A and 2101B and estimates the SOH of the assembled battery 110. As a result, it is possible to accurately determine the deteriorating status of the assembled battery 110 in the battery system 100.

The SOH estimating unit 2501 may determine whether the lifespan of the assembled battery 110 expires on the basis of the estimation result of the SOH of the assembled battery 110. As a result, it is possible to accurately determine the expiration of the lifespan of the assembled battery 110 in the battery system 100.

In the above-mentioned embodiments, the present invention has been specifically described, but the present invention is not limited to the embodiments and can be modified in various forms without departing from the gist thereof. The embodiments may be arbitrarily combined for practice.

The configurations, functions, processing units, and the like may be embodied by hardware by designing all or a part thereof, for example, as an integrated circuit or may be embodied by software by causing a processor to execute a program for realizing the functions. Information of programs, tables, and the like for realizing the functions can be stored in a storage device such as a memory or a hard disk or a storage medium such as an IC card or a DVD. Programs for realizing the processes described above in the embodiments may be supplied to the assembled battery control unit 150 of the battery system 100 according to the embodiments via the storage medium or an electrical communication line such as Internet.

Figure 26:
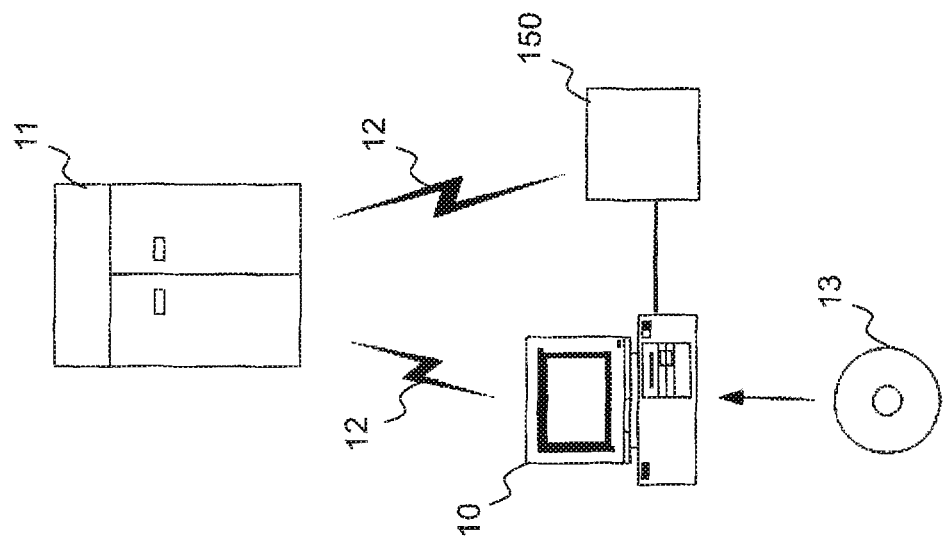
FIG. 26 is a diagram illustrating a state in which a program is provided to an assembled battery control unit.

FIG. 26 is a diagram illustrating a state in which a program is provided to the assembled battery control unit 150. A personal computer 10 is connected to the assembled battery control unit 150 and supplies a program supplied from a server device 11 via a communication line 12 or a program read from a CD-ROM 13 to the assembled battery control unit 150. A program may be supplied to the assembled battery control unit 150 via the communication line 12 from a server device 11 without using the personal computer 10. Examples of the communication line include a communication line such as Internet or PC communication, an exclusive communication line, and a mobile phone circuit network. The server device 11 transmits a program to the personal computer 10 or the assembled battery control unit 150 via the communication line 12. That is, the program is converted into a data signal over carrier waves and is transmitted via the communication line 12. In this way, the program which can be executed by the assembled battery control unit 150 can be provided as various types of computer-readable program product such as a recording medium or carrier waves.

Disclosure of the following application from which priority is claimed is incorporated herein by reference:
Japanese Patent Application No. 2014-146749 (field on Jul. 17, 2014).

REFERENCE SIGNS LIST

100: battery system, 110: assembled battery, 111: single cell, 112: single cell group, 120: single cell managing unit, 121: single cell control unit, 122: voltage detecting circuit, 123: control circuit, 124: signal input/output circuit, 125: temperature detecting unit, 130: current detecting unit, 140: voltage detecting unit, 150: assembled battery control unit, 160: signal communication unit, 170: insulated element, 180: storage unit, 200: vehicle control unit, 300a to 300d: relay, 301: SOC calculating unit, 302: permissible current calculating unit, 400: inverter, 410: motor-generator, 420: charger, 701: internal resistance detecting unit, 702: battery state predicting unit, 703: first permissible current calculating unit, 704: second permissible current calculating unit, 705: permissible charging current determining unit, 706: permissible discharging current determining unit, 2001A, 2001B, 2101A, 2101B: correction unit, 2301, 2401, 2501: SOH estimating unit

The invention claimed is:

1. A battery state detection device that detects a battery state, comprising:
  a processor that is operatively coupled to a battery, a voltage detector, and a current detector, the processor being configured to:
    calculate a first permissible current of the battery using a calculated internal resistance value that is calculated based on at least a voltage of the battery detected by the voltage detector and a current flowing in the battery detected by a current detector;
    calculate a second permissible current of the battery using an estimated internal resistance value that is extracted from the battery and stored in the battery state detection device in advance;
    determine a permissible current of the battery corresponding to the battery state on the basis of at least one of the first permissible current and the second permissible current,
    determine the first permissible current as the permissible current of the battery when the battery is in a state in which the first permissible current is able to be calculated, and determines the second permissible current as the permissible current of the battery when the battery is in a state in which the first permissible current is not able to be calculated;
    determine the first permissible current as the permissible current of the battery for a charging side and determine the second permissible current as the permissible current of the battery for a discharging side when the battery is charged;
    determine the second permissible current as the permissible current of the battery for the charging side and determine the first permissible current as the permissible current of the battery for the discharging side when the battery discharges; and
    switch the permissible current of the battery between the first permissible current and the second permissible current for the charging side and the discharging side with switching of the charging and discharging of the battery.

2. The battery state detection device according to claim 1, wherein the processor is also configured to
  determine that the battery is in the state in which the first permissible current is able to be calculated and determine the first permissible current as the permissible current of the battery when a charging/discharging current of the battery is equal to or greater than a predetermined threshold value, and
  determine that the battery is in the state in which the first permissible current is not able to be calculated and determine the second permissible current as the permissible current of the battery when the charging/discharging current of the battery is less than the predetermined threshold value.

3. The battery state detection device according to claim 1, wherein the processor is also configured to
  determine the second permissible current as the permissible current of the battery before charging or discharging of the battery is started, and switch the permissible current of the battery from the second permissible current to the first permissible current after charging or discharging of the battery is started.

4. The battery state detection device according to claim 1, wherein the processor is also configured to determine the permissible current of the battery by determining weighting factors for the first permissible current and the second permissible current and weighting and summing the first permissible current and the second permissible current on the basis of the weighting factors.

5. The battery state detection device according to claim 4, wherein the processor is also configured to change the weighting factors during charging or discharging of the battery.

6. The battery state detection device according to claim 5, wherein the processor is also configured to
relatively increase the weighting factor for the second permissible current before charging or discharging of the battery is started, and
gradually increase the weighting factor for the first permissible current and gradually decrease the weighting factor for the second permissible current after charging or discharging of the battery is started.

7. The battery state detection device according to claim 4, wherein the processor is also configured to
calculate an error of the first permissible current,
calculate an error of the second permissible current, and
determine the weighting factors on the basis of at least one of the error of the first permissible current and the error of the second permissible current.

8. The battery state detection device according to claim 1, wherein the processor is also configured to compare the first permissible current and the second permissible current and to correct the second permissible current on the basis of the comparison result.

9. A secondary battery system comprising:
the battery state detection device according to claim 1; and
a secondary battery of which a voltage is detected by the processor and which is subjected to charging or discharging on the basis of the permissible current determined by the processor.

10. A non-transitory computer readable medium storing instructions, which when executed cause a processor to:
calculate a first permissible current of a battery using a calculated internal resistance value that is calculated based on at least a voltage of the battery detected by a voltage detector and a current flowing in the battery detected by a current detector;
calculate a second permissible current of the battery using an estimated internal resistance value that is extracted from the battery and stored in a device in advance;
determine a permissible current of the battery corresponding to a battery state on the basis of at least one of the first permissible current and the second permissible current;
determine the first permissible current as the permissible current of the battery when the battery is in a state in which the first permissible current is able to be calculated, and determines the second permissible current as the permissible current of the battery when the battery is in a state in which the first permissible current is not able to be calculated;
determine the first permissible current as the permissible current of the battery for a charging side and determine the second permissible current as the permissible current of the battery for a discharging side when the battery is charged;
determine the second permissible current as the permissible current of the battery for the charging side and determine the first permissible current as the permissible current of the battery for the discharging side when the battery discharges; and
switch the permissible current of the battery between the first permissible current and the second permissible current for the charging side and the discharging side with switching of the charging and discharging of the battery.

11. A battery state detection method of detecting a battery state, comprising:
providing a processor that is operatively coupled to a battery, a voltage detector, and a current detector, and using the processor;
calculating a first permissible current of the battery using a calculated internal resistance value that is calculated based on at least a voltage of the battery detected by the voltage detector and a current flowing in the battery detected by the current detector;
calculating a second permissible current of the battery using an estimated internal resistance value that is extracted from the battery and stored in a device in advance;
determining a permissible current of the battery corresponding to the battery state on the basis of at least one of the first permissible current and the second permissible current;
determining the first permissible current as the permissible current of the battery when the battery is in a state in which the first permissible current is able to be calculated, and determines the second permissible current as the permissible current of the battery when the battery is in a state in which the first permissible current is not able to be calculated;
determining the first permissible current as the permissible current of the battery for a charging side and determine the second permissible current as the permissible current of the battery for a discharging side when the battery is charged;
determining the second permissible current as the permissible current of the battery for the charging side and determine the first permissible current as the permissible current of the battery for the discharging side when the battery discharges; and
switching the permissible current of the battery between the first permissible current and the second permissible current for the charging side and the discharging side with switching of the charging and discharging of the battery.

* * * * *